(12) United States Patent
Kanna

(10) Patent No.: US 7,042,133 B2
(45) Date of Patent: May 9, 2006

(54) SURFACE ACOUSTIC WAVE DEVICE AND METHOD OF ADJUSTING A TEMPERATURE CHARACTERISTIC OF THE SAME

(75) Inventor: Shigeo Kanna, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 204 days.

(21) Appl. No.: 10/671,698

(22) Filed: Sep. 29, 2003

(65) Prior Publication Data

US 2004/0135469 A1 Jul. 15, 2004

(30) Foreign Application Priority Data

| Oct. 4, 2002 | (JP) | ............................. 2002-292375 |
| Feb. 19, 2003 | (JP) | ............................. 2003-041779 |
| Jul. 31, 2003 | (JP) | ............................. 2003-284152 |

(51) Int. Cl.
*H03H 9/25* (2006.01)

(52) U.S. Cl. .................................... 310/313 A; 310/360
(58) Field of Classification Search ............ 310/313 A, 310/311, 360; 333/193, 195
See application file for complete search history.

(56) References Cited

U.S. PATENT DOCUMENTS

| 4,193,045 A | | 3/1980 | Houkawa et al. |
| 4,670,681 A | * | 6/1987 | Wright .................... 310/313 A |
| 5,895,996 A | | 4/1999 | Takagi et al. |
| 6,784,595 B1 | * | 8/2004 | Iizawa et al. ............... 310/311 |
| 6,856,218 B1 | * | 2/2005 | Yamazaki et al. .......... 333/193 |

FOREIGN PATENT DOCUMENTS

| JP | A 53-145595 | 12/1978 |
| JP | 57-073513 | 5/1982 |
| JP | 58-039105 | 3/1983 |
| JP | 59-151517 | 8/1984 |
| JP | 60-196007 | 10/1985 |
| JP | A 63-018892 | 1/1988 |
| JP | A 2003-152487 | 5/2003 |

OTHER PUBLICATIONS

Kohji Hohkawa et al, "Surface Acoustic Wave Temperature Compensated Oscillator", Musashino Electrical Communication Laboratory, N.T.T. pp. 27-34.
Koichi Hirama et al, "A Temperature Compensated Crystal Oscillator Utilizing Three Crystals" 73/3 vol. 56-A No. 3 pp. 155-162.
Minowa et al., "The Center Frequency and its Temperature Characteristics of Saw-Devices Utilising Quartz Substrates," Technical Report of IEICE, US76-23, No. 78, Jul. 1976, pp. 9-16. (w/trans.).

* cited by examiner

*Primary Examiner*—Thomas M. Dougherty
(74) *Attorney, Agent, or Firm*—Oliff & Berridge, PLC

(57) ABSTRACT

The invention miniaturizes a surface acoustic wave device on which a plurality of surface acoustic wave elements are disposed and connected together in parallel on a plate, and provides a good temperature characteristic in a wide temperature range. A surface acoustic wave device according to the invention includes a plurality of surface acoustic wave elements disposed on a main surface of a quartz plate cut out with a Euler angle at (0°, 113° to 135°, +/-(40 to 49)°). Surface acoustic waves have propagation directions "$\psi$" which are different each other. When the Euler angle is set at (0°, $\theta$, $\psi$), it is possible to reduce differences in each propagation direction by setting each propagation angle so as to satisfy a formula: $\psi=0.3295\theta+3.3318°+/-1.125°$. This makes it possible to decrease the angle among the surface acoustic wave elements, and thereby miniaturizes the surface acoustic wave elements.

12 Claims, 19 Drawing Sheets

SURFACE ACOUSTIC WAVE DEVICE AND METHOD OF ADJUSTING A TEMPERATURE CHARACTERISTIC OF THE SAME

BACKGROUND OF THE INVENTION

1. Field of Invention

The present invention relates to a surface acoustic wave (SAW) device. More particularly, the invention relates to a SAW device that includes a quartz plate and reduces frequency changes due to temperature variations, and to a method of adjusting a temperature characteristic.

2. Description of Related Art

Related art SAW devices include interdigital transducer (IDT) electrodes on the main surface of a piezoelectric plate represented by a piece of quartz so as to oscillate a high-frequency region in a stable manner. Among such SAW devices, in order to reduce frequency changes due to temperature variations, the related art also includes ST-cut SAW devices which include an ST-cut quartz plate as a piezoelectric plate, transmit SAW in the direction of the X-axis (the electrical axis) of the ST-cut quartz plate, and generate a Rayleigh wave, which is a kind of SAW.

In order to further reduce frequency changes due to temperature variations, a plurality of SAW elements are disposed on an ST-cut quartz plate in a manner that propagation directions of SAW generated by the SAW elements are different each other in one case, or in a manner that electrode thicknesses of IDT electrodes are different each other in another case, as disclosed in Japanese Unexamined Patent Application Publication No. 53-145595, for example.

Alternatively, an ST-cut quartz plate is rotated around the Z'-axis in an in-plane direction (hereinafter "in-plane rotation ST-cut quartz plate"). Then, a SAW element is disposed on the in-plane rotation ST-cut quartz plate (hereinafter "in-plane rotation ST-cut SAW device"), as disclosed in Japanese Examined Patent Application Publication No. 63-18892, for example.

SUMMARY OF THE INVENTION

However, the turnover temperature (a temperature which provides an extremum of frequency) of temperature characteristics (frequency change characteristics depending on temperature variations) of an ST-cut SAW device based on propagation directions changes little. For example, even if a propagation direction is changed by 10°, the turnover temperature changes by 20° C. or below, as disclosed in Minowa, Jumonji. 1976. "Suishouban wo Mochiita Danseihyomenha Soshi no Chushin Shuhasu to sono Ondo Tokusei (Central Frequencies and Temperature Characteristics of Surface Acoustic Wave Elements Using a Quartz Plate)." *Technical Report of IEICE* 76 (July), No. 78: 9–16, US76-23, Institute of Electronics, Information, and Communication Engineers, Japan, for example. Thus, when disposing a plurality of SAW elements on an ST-cut quartz plate, it is necessary to increase an angle among the SAW elements. In particular, when increasing the number of SAW elements to be disposed in order to decrease frequency changes in a wide temperature range, an angle made between a SAW element which provides a minimum value of turnover temperatures and a SAW element which provides a maximum value of turnover temperatures is inevitably large. Consequently, it is difficult to miniaturize a SAW device on which a plurality of SAW elements are disposed on an ST-cut quartz plate in a manner that the propagation directions of SAW generated by each of the SAW elements are different. Furthermore, IDT electrodes disposed in a tilted position involve the following problem as frequency increases.

A pattern of IDT electrodes is generally formed by using a photomask process. In the photomask process, a diagonal line is formed by a group of short lines aligned in a manner of stairs. Since lines in IDT electrodes become thin in response to high frequency, such a stairlike arrangement of the group of short lines cannot be neglected, since the arrangement of IDT electrodes disposed in a tilted position come to be seen as non-smooth (that is, the electrode width of the IDT electrodes becomes unstable). The non-smooth arrangement of IDT electrodes could cause unnecessary oscillations, which may cause a defect.

When disposing a plurality of SAW elements having different electrode thicknesses of IDT electrodes on an ST-cut quartz plate, it is possible to dispose the IDT electrodes in parallel. However, it is necessary to form a plurality of settings of electrode thicknesses on the same quartz plate, and thereby a manufacturing process becomes complicated.

The in-plane rotation ST-cut SAW device is far superior in temperature characteristics to the ST-cut SAW device. With regard to a temperature characteristic of a SAW element, however, it has a problem that it does not provide sufficient accuracy, since the wider an operating temperature range is, the larger frequency changes become.

In consideration of the above and/or other problems, the present invention provides a SAW device which provides a good temperature characteristic in a wide temperature range and which can be miniaturized. The invention also provides a method of adjusting temperature characteristics of the SAW device.

A surface acoustic wave device includes: a quartz plate cut out with a Euler angle at (0°, 113° to 135°, +/−(40 to 49)°); and a plurality of surface acoustic wave elements M1 to Mn connected together in parallel on a main surface of the quartz plate, and provided with at least a pair of IDT electrodes to generate a Rayleigh wave. Surface acoustic waves having at least a plurality of different propagation directions of propagation directions ψ1 to ψn are generated from the surface acoustic wave elements M1 to Mn. The propagation directions ψ1 to ψn satisfy a formula: ψ1 to ψn=0.3295θ+3.3318°+/−1.125°, with the Euler angle at (0°, θ, ψ).

This structure makes it possible to change turnover temperatures without differentiating the propagation directions ψ1 to ψn greatly each other.

Alternatively, a surface acoustic wave device includes: a quartz plate cut out with a Euler angle at (0°, 113° to 135°, +/−(40 to 49)°); and a plurality of surface acoustic wave elements M1 to Mn connected together in parallel on a main surface of the quartz plate, and provided with at least a pair of IDT electrodes to generate a Rayleigh wave. At least a plurality of different ratios η1 to ηn each other obtained by dividing electrode width by electrode pitch of the IDT electrodes is given to the surface acoustic wave elements M1 to Mn. The Euler angle at (0°, θ, ψ) satisfies a formula: ψ1 to ψn=0.3295θ+3.3318°+/−1.125°.

This structure makes it possible to provide a good temperature characteristic in a wide range of temperatures, and to dispose the IDT electrodes in parallel.

Alternatively, a surface acoustic wave device includes: a quartz plate cut out with a Euler angle at (0°, 113° to 135°, +/−(40 to 49)°); and a plurality of surface acoustic wave elements M1 to Mn connected together in parallel on a main surface of the quartz plate, and provided with at least a pair of IDT electrodes to generate a Rayleigh wave. At least a plurality of different ratios η1 to ηn obtained by dividing electrode width by electrode pitch of the IDT electrodes is given to the surface acoustic wave elements M1 to Mn. Surface acoustic waves having at least a plurality of different propagation directions each other out of propagation directions ψ1 to ψn is generated from the surface acoustic wave elements M1 to Mn. The propagation directions ψ1 to ψn satisfy a formula: ψ1 to ψn=0.3295θ+3.3318°+/−1.125°, with Euler angle at (0°, θ, ψ).

This structure makes it possible to change turnover temperatures without differentiating the propagation directions ψ1 to ψn greatly each other, and to provide a good temperature characteristic in a wide range of temperatures.

In addition, with regard to a SAW device according to the invention, at least one of turnover temperatures Tp1 to Tpn of a temperature characteristic obtained by each of the SAW elements M1 to Mn is out of an operating temperature range. This makes it possible to provide a good temperature characteristic in the operating temperature range, even if the turnover temperatures Tp1 to Tpn of a temperature characteristic obtained by each of the SAW elements M1 to Mn deviate from desired values due to a deviation from a manufacturing process.

Furthermore, with regard to a SAW device according to the invention, a temperature characteristic is adjusted by adjusting an angle of disposing the SAW device on the quartz plate cut out so as to set a Euler angle at (0°, 113° to 135°, +/−(40 to 49)°).

This makes it possible to provide a good temperature characteristic in an operating temperature range, even if turnover temperatures Tp1 to Tpn of a temperature characteristic obtained by each of the SAW elements M1 to Mn deviate from desired values because of a deviation from a manufacturing process, and to readily change a temperature range which provides a good temperature characteristic when changing the operating temperature range.

DETAILED DESCRIPTION OF PREFERRED EMBODIMENTS

Exemplary modes for carrying out the present invention are described below with reference to the accompanying drawings. The exemplary embodiments discussed below do not limit the description of the invention. Furthermore, all the components shown in the exemplary embodiments below are not always necessary.

[First Exemplary Embodiment]

A first exemplary embodiment of the present invention is described below with reference to the drawings.

Figure 1:
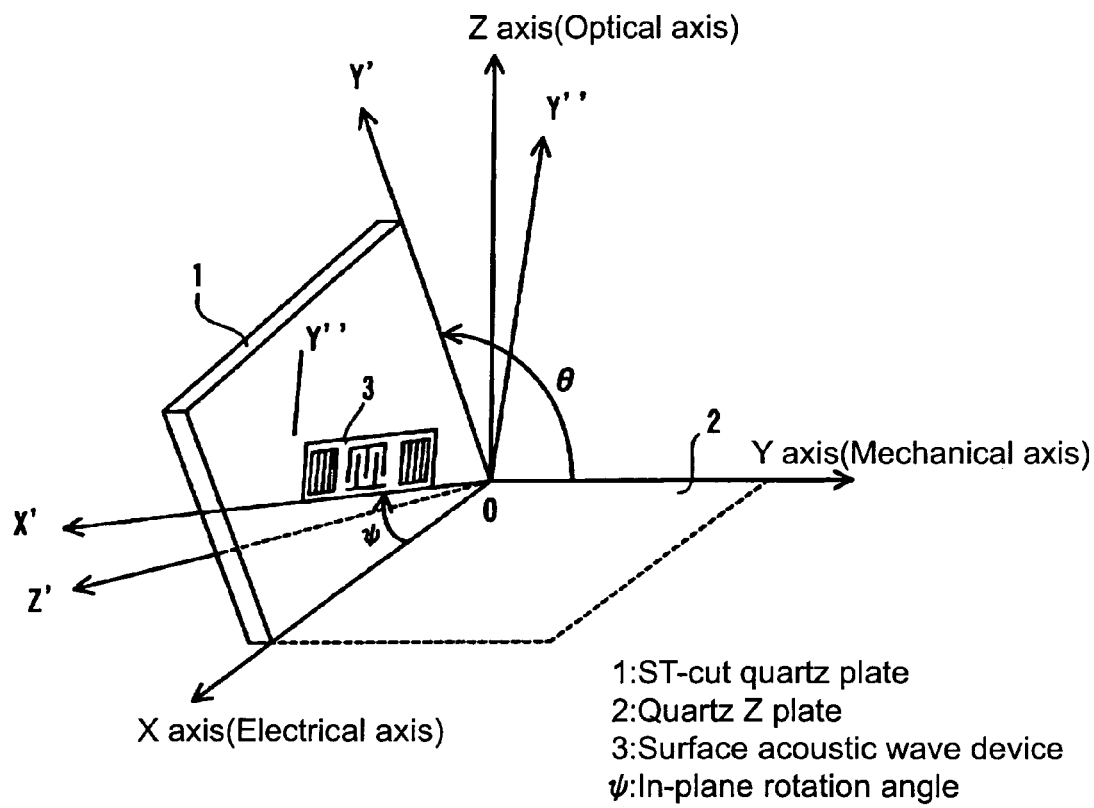
FIG. 1 is a schematic illustrating cut angles of quartz.

FIG. 1 is a schematic illustrating cut angles of quartz. When forming a piezoelectric resonator by cutting quartz, temperature characteristics may vary depending on the direction of cutting. As shown in FIG. 1, the crystal axes of quartz are defined by the electrical axis (X), the mechanical axis (Y), and the optical axis (Z). A quartz Z plate 2 with Euler angle (ø, θ, ψ) at (0°, 0°, 0°) is rotated around the electrical axis (X), by making "θ" be set at 113 to 135 degrees to be an ST-cut quartz plate 1 having new axes of coordinate (X, Y', Z'). The plate 1, referred to as a ST-cut plate is cut out along the new axes of coordinate (X, Y', Z'). Next, the ST-cut quartz plate 1 is further rotated around the Z' axis of the ST-cut quartz plate 1, by making "ψ" be set at +/−(40 to 49) degrees, so as to set the direction of transmitting SAW to this angle. A piezoelectric resonator including this further rotated plate is called an in-plane rotation ST-cut SAW device 3. The in-plane rotation ST-cut SAW device 3 can have excellent temperature characteristics, which is regarded as a two-dimensional function like other ST-cut devices. However, after thorough consideration, the inventor found that the temperature characteristics represent a three-dimensional function with an inflection point at around 110° C. Since the temperature characteristics are generally not observed at temperatures well over 110° C., the fact that the temperature characteristics of the in-plane rotation ST-cut SAW device 3 using an in-plane rotation ST-cut quartz plate 9 represent a three-dimensional function is unknown.

Figure 2:
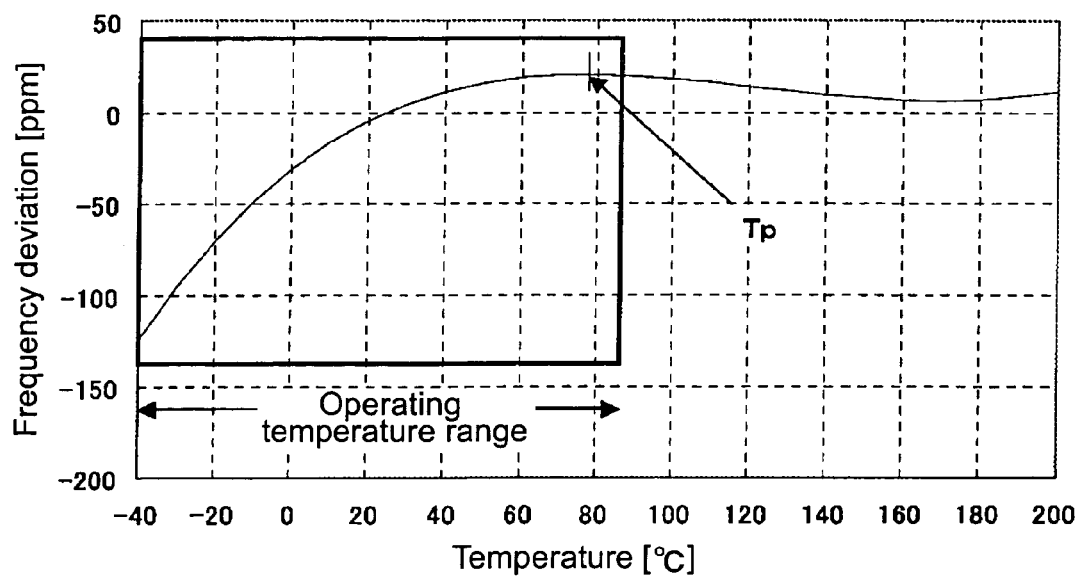
FIG. 2 is a graph showing a temperature characteristic curve with an extreme value.

FIG. 2 is a graph showing a temperature characteristic curve with an extreme value. With regard to the temperature characteristic of the in-plane rotation ST-cut SAW device 3, an inflection point is around 110° C. If an operating temperature range of the device is set below the inflection point, for example, at −40 to 85° C., this device is used within the temperature range (an area surrounded by a square in FIG. 2) including a maximum value (Tp) below the inflection point out of the temperature characteristic curve as a three-dimensional function.

Figure 3:
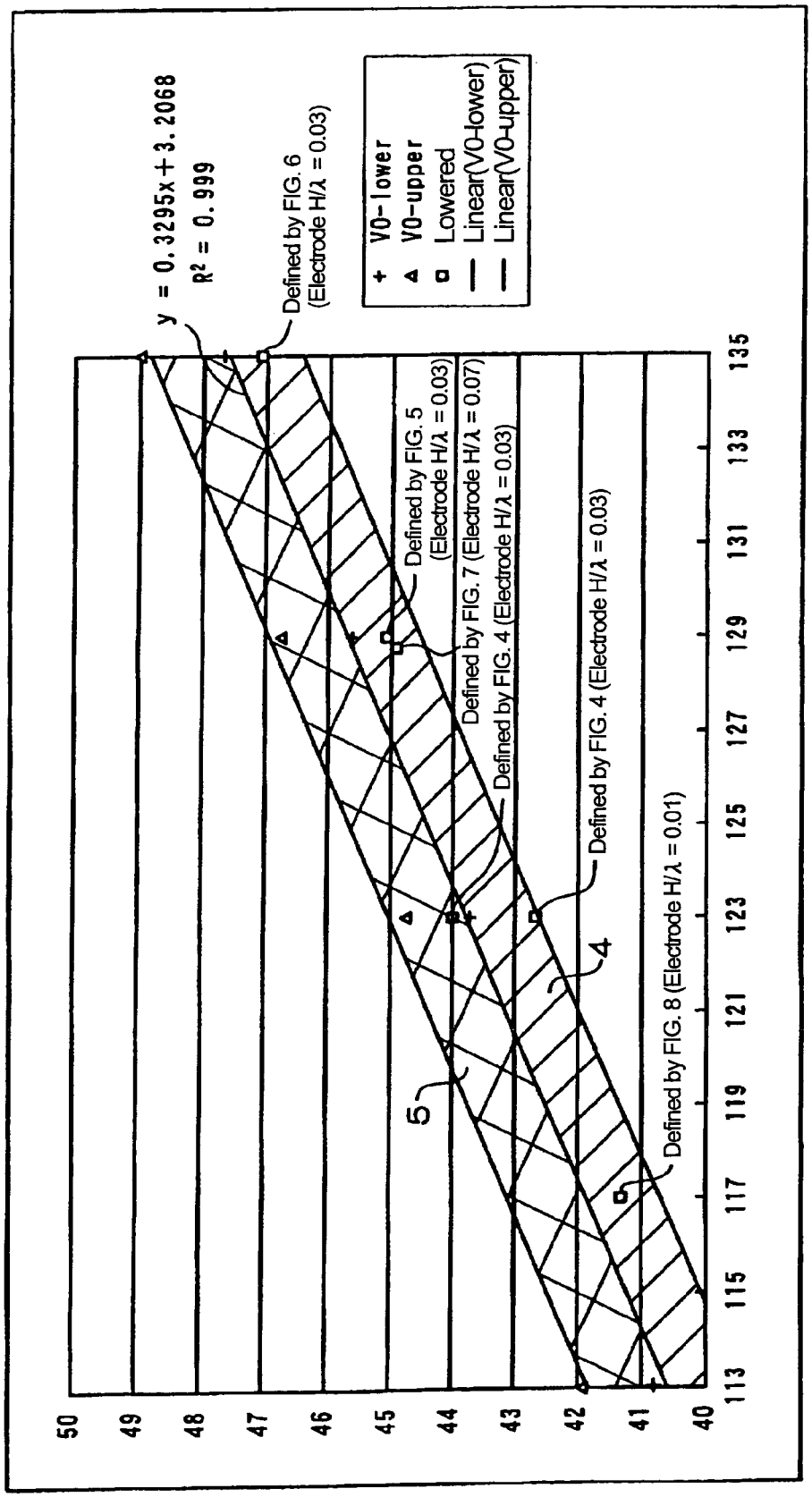
FIG. 3 is a graph showing ranges where a temperature characteristic curve with an extreme value is easily available for the in-plane rotation ST-cut quartz plate whose Euler angle is set at (0°, 113° to 135°, +/−(40 to 49)°)

FIG. 3 is a graph showing ranges where a temperature characteristic curve with an extreme value is easily available for the in-plane rotation ST-cut quartz plate 9 with its Euler angle at (0°, 113° to 135°, +/−(40 to 49)°).

After thorough studies, in the range of the graph having temperature characteristics as a three-dimensional function, the inventor found the range of "θ" and "ψ" where a temperature characteristic curve with an extreme value (a local maximum or local minimum value) in a temperature range from −40 to 85° C. is easily available for a transversal SAW device. This range is shown in the graph as a hatched area 5.

On the other hand, a hatched area 4 in FIG. 3 is an area not covered by the hatched area 5, in which the range of "θ" and "ψ" where a temperature characteristic curve with an extreme value (a local maximum or local minimum value) in the above-mentioned temperature range is easily available for a resonator SAW device. In the hatched area 4, the values "ψ" are smaller than those in the hatched area 5 under the influence that the resonator SAW device is provided with electrodes. The area that covers both the hatched area 4 and the hatched area 5 is defined by the formula below.

$$\psi = 0.3295\theta + 3.3318° +/- 1.125°$$ (Formula 1)

By performing in-plane rotation around the Z' axis in the area that covers both the hatched area 4 and the hatched area 5, a frequency temperature characteristic curve with an extreme value (a local maximum or local minimum value) is easily available.

The inventor verified temperature characteristics in the border area between the hatched area 4 and the hatched area 5, and checked the validity of the hatched area 4 and the hatched area 5.

Also according to the first exemplary embodiment of the invention, the "in-plane rotation ST-cut SAW device 3" is defined as including both transversal SAW filters and resonator SAW devices (including SAW resonators and resonator SAW filters).

FIGS. 9 to 12 are graphs each showing whether there is an extreme value of a three-dimensional function for a transversal SAW filter using the in-plane rotation ST-cut quartz plate 9 with its Euler angle at (0°, 113° to 135°, +/−(40 to 49)°).

According to these graphs, the inventor found the range of "θ" and "ψ" in which a temperature characteristic with an extreme value (a local maximum or local minimum value) in a temperature range from −40 to 85° C. is easily available for a SAW device having a transversal SAW filter. This range is shown in FIG. 3 as a hatched area 5, which is defined by the formula below.

$$\psi = 0.3295\theta + 3.8318° +/- 0.625°$$ (Formula 2)

Moreover, the inventor found various patterns for not only temperature characteristics of the transversal SAW filter, but also those of resonator SAW devices as a result of thorough studies. Specifically, a transversal SAW filter is provided with an IDT electrode (a comb-shaped electrode) at the source side and an IDT electrode at the receiving side with a certain interval between the electrodes on the surface of a quartz plate which is a piezoelectric material. With regard to such a SAW filter, because nothing is formed between the IDT electrodes, the width, thickness, and other factors of the electrodes cause little change in temperature characteristics of frequencies (that is, changing the shape of the electrodes does not have much effect on the temperature characteristics). Regarding a resonator SAW device, however, an IDT electrode is formed on the surface of a quartz plate, which is a piezoelectric material, and a reflector electrode is provided so as to sandwich the IDT electrode. Therefore, temperature characteristics are variable depending on the width, thickness, and other factors of the IDT electrode.

Figure 4:
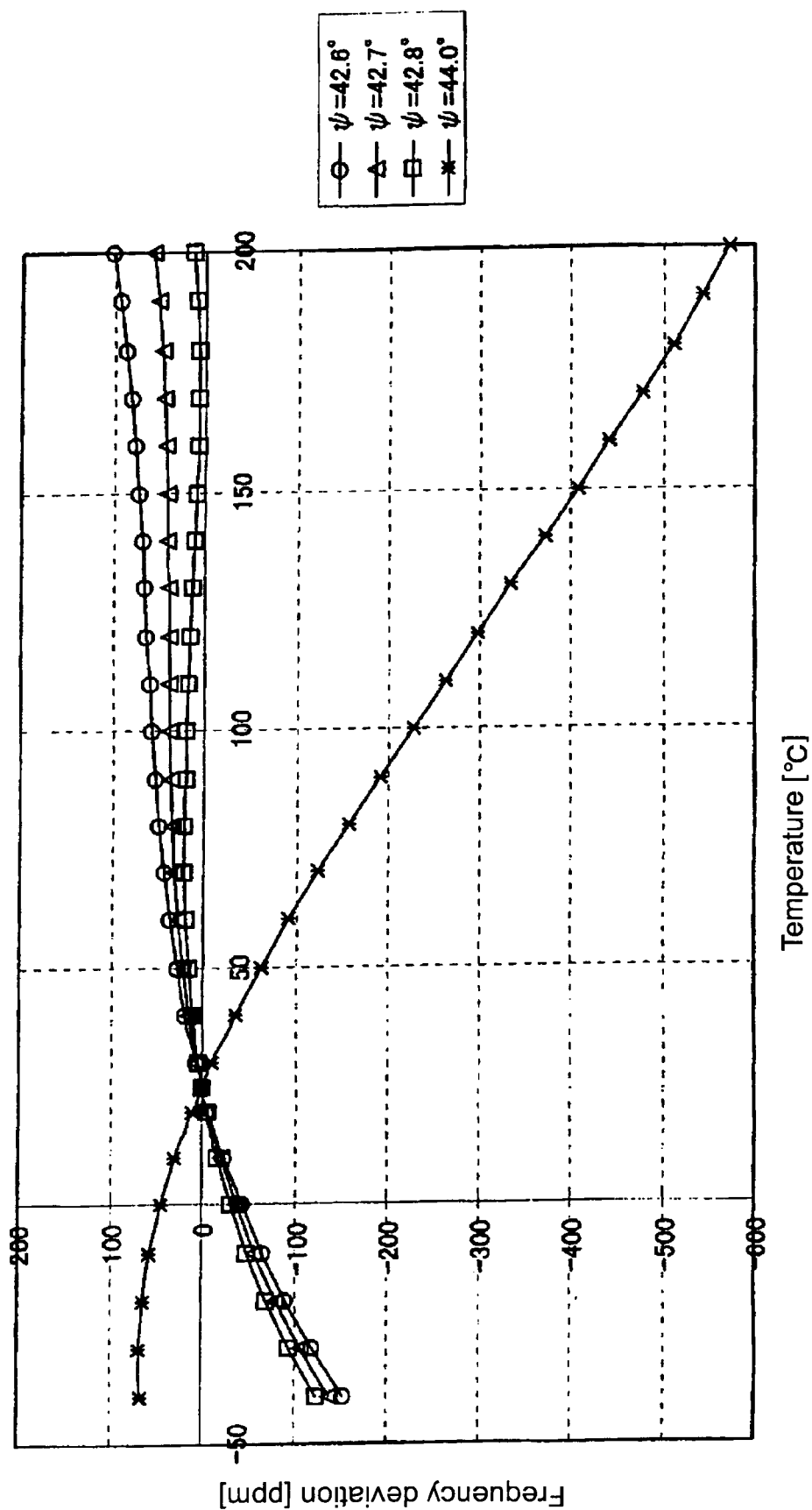
FIG. 4 is a graph showing whether there is an extreme value of the three-dimensional function for the resonator SAW device including the in-plane rotation ST-cut quartz plate whose Euler angle is set at (0°, 113° to 135°, +/−(40 to 49)°)
Figure 5:
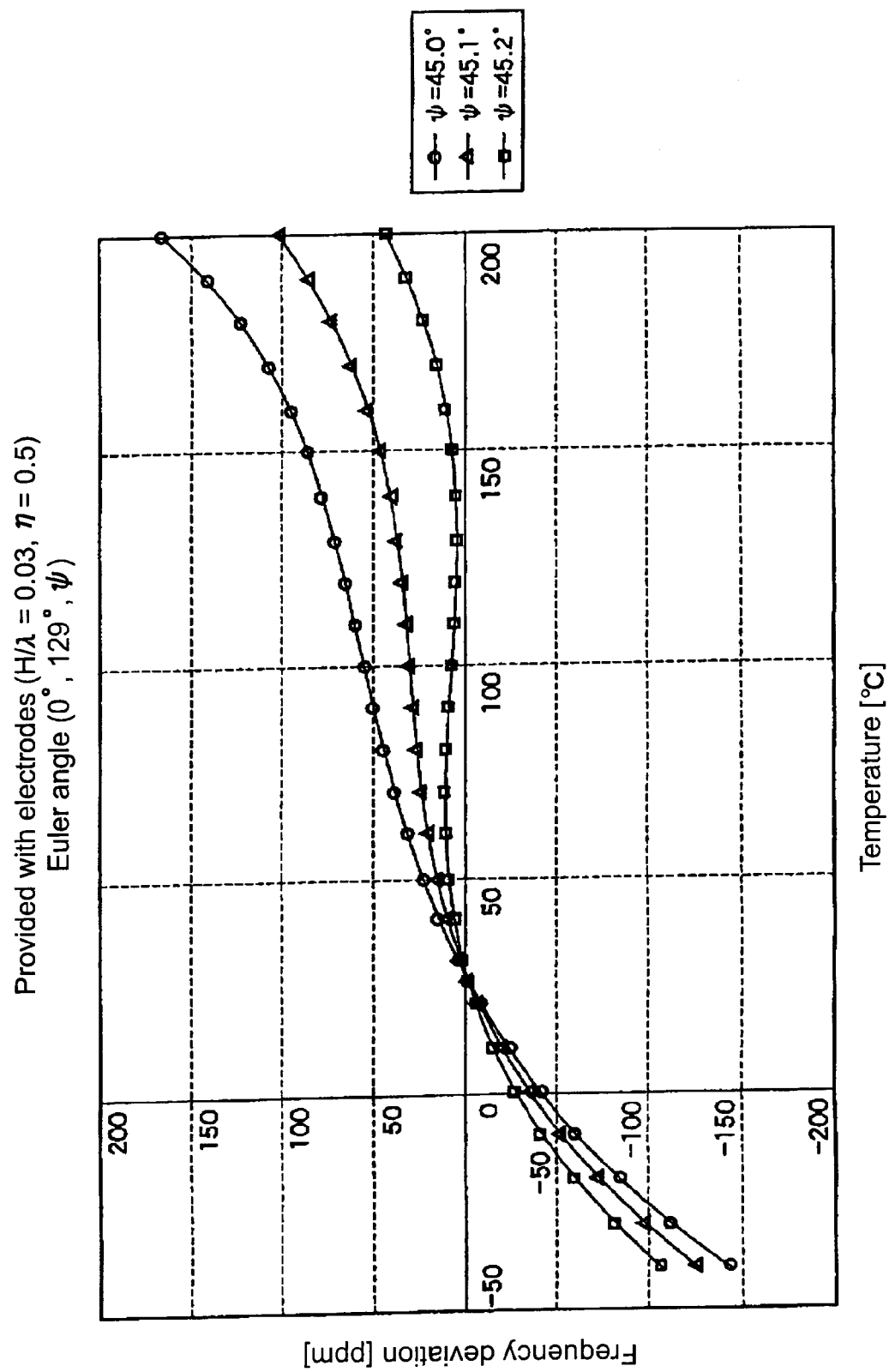
FIG. 5 is a graph showing whether there is an extreme value of the three-dimensional function for the resonator SAW device including the in-plane rotation ST-cut quartz plate whose Euler angle is set at (0°, 113° to 135°, +/−(40 to 49)°)
Figure 6:
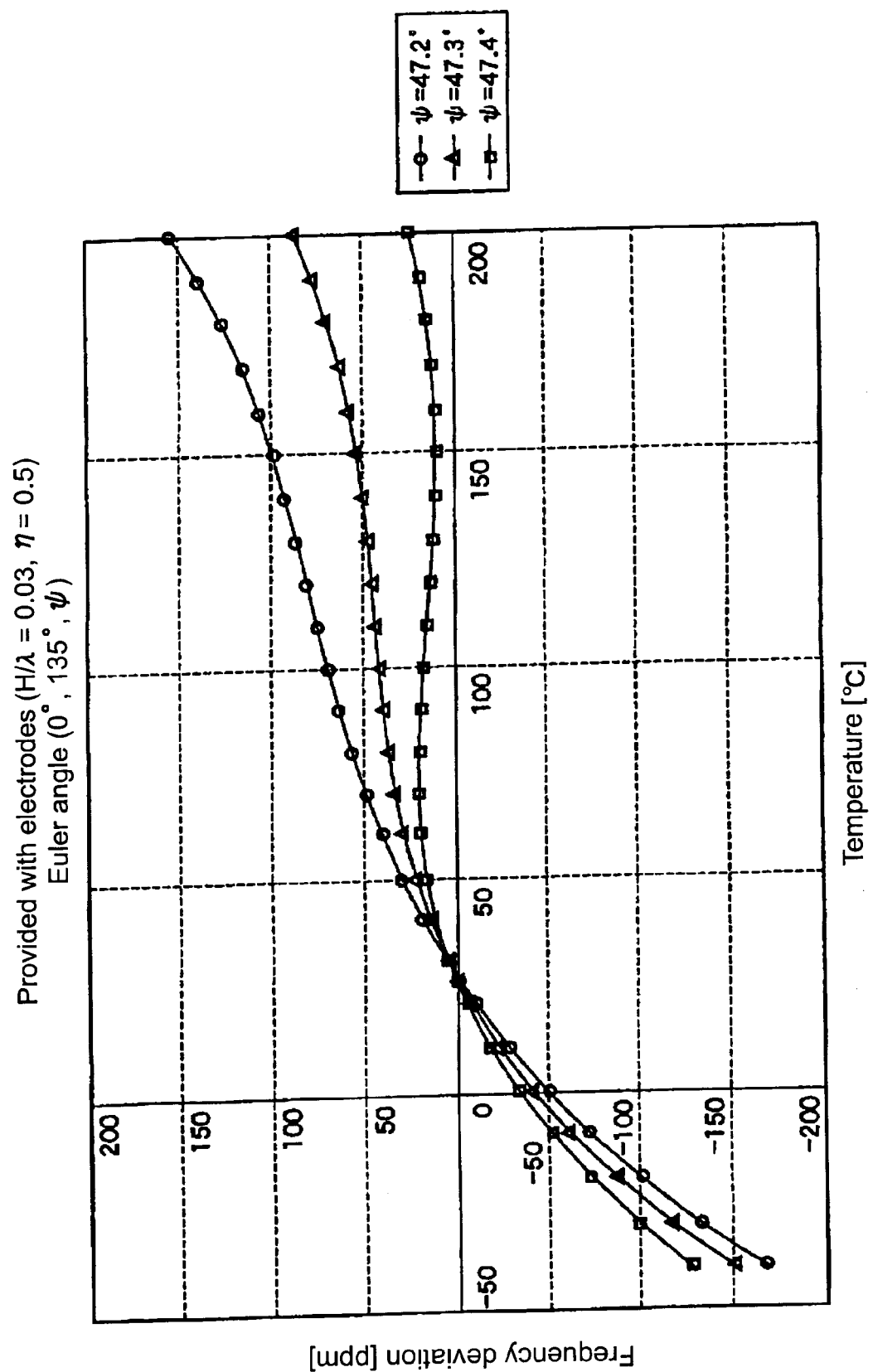
FIG. 6 is a graph showing whether there is an extreme value of the three-dimensional function for the resonator SAW device including the in-plane rotation ST-cut quartz plate whose Euler angle is set at (0°, 113° to 135°, +/−(40 to 49)°)
Figure 7:
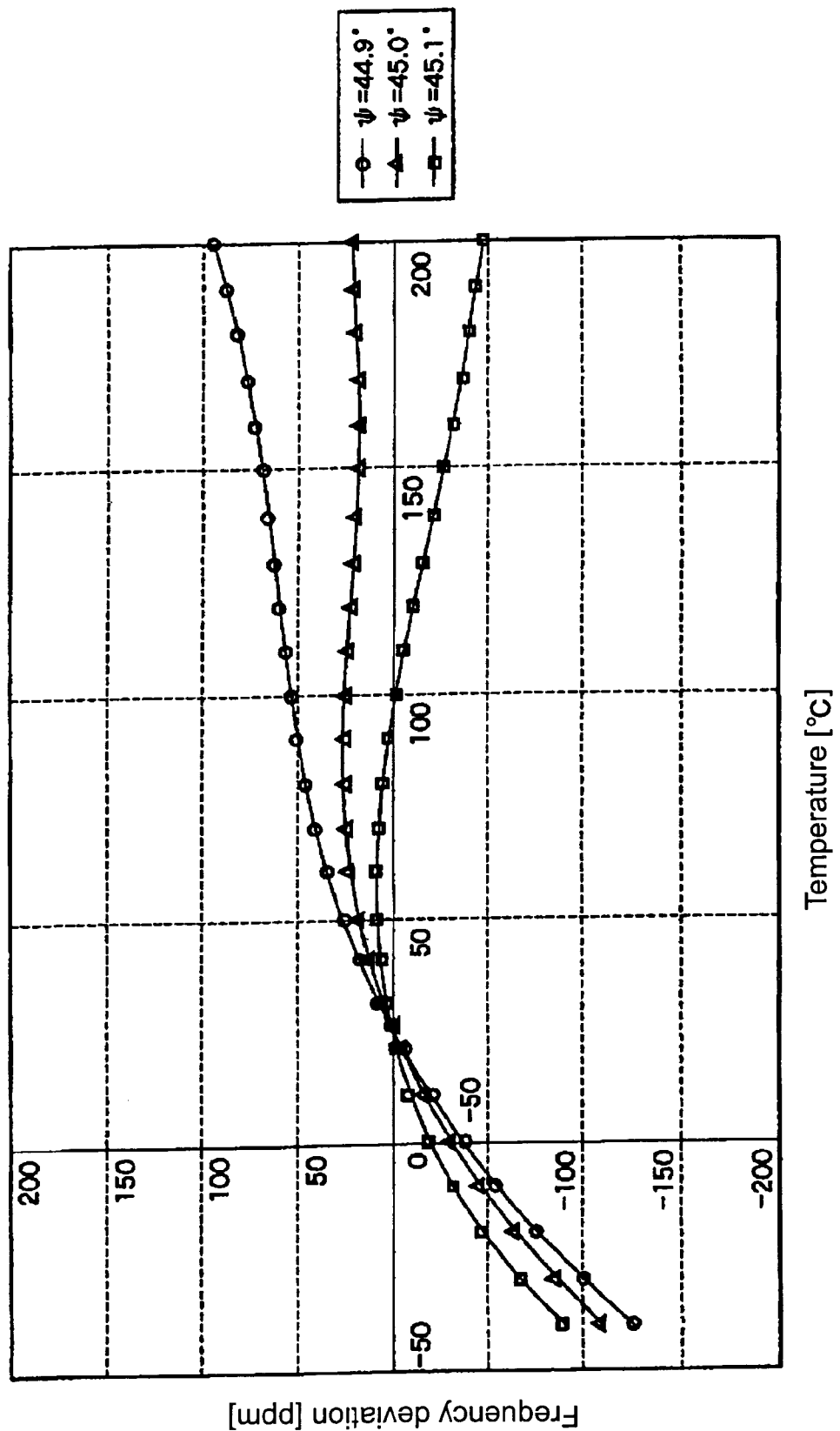
FIG. 7 is a graph showing whether there is an extreme value of the three-dimensional function for the resonator SAW device including the in-plane rotation ST-cut quartz plate whose Euler angle is set at (0°, 113° to 135°, +/−(40 to 49)°)
Figure 8:
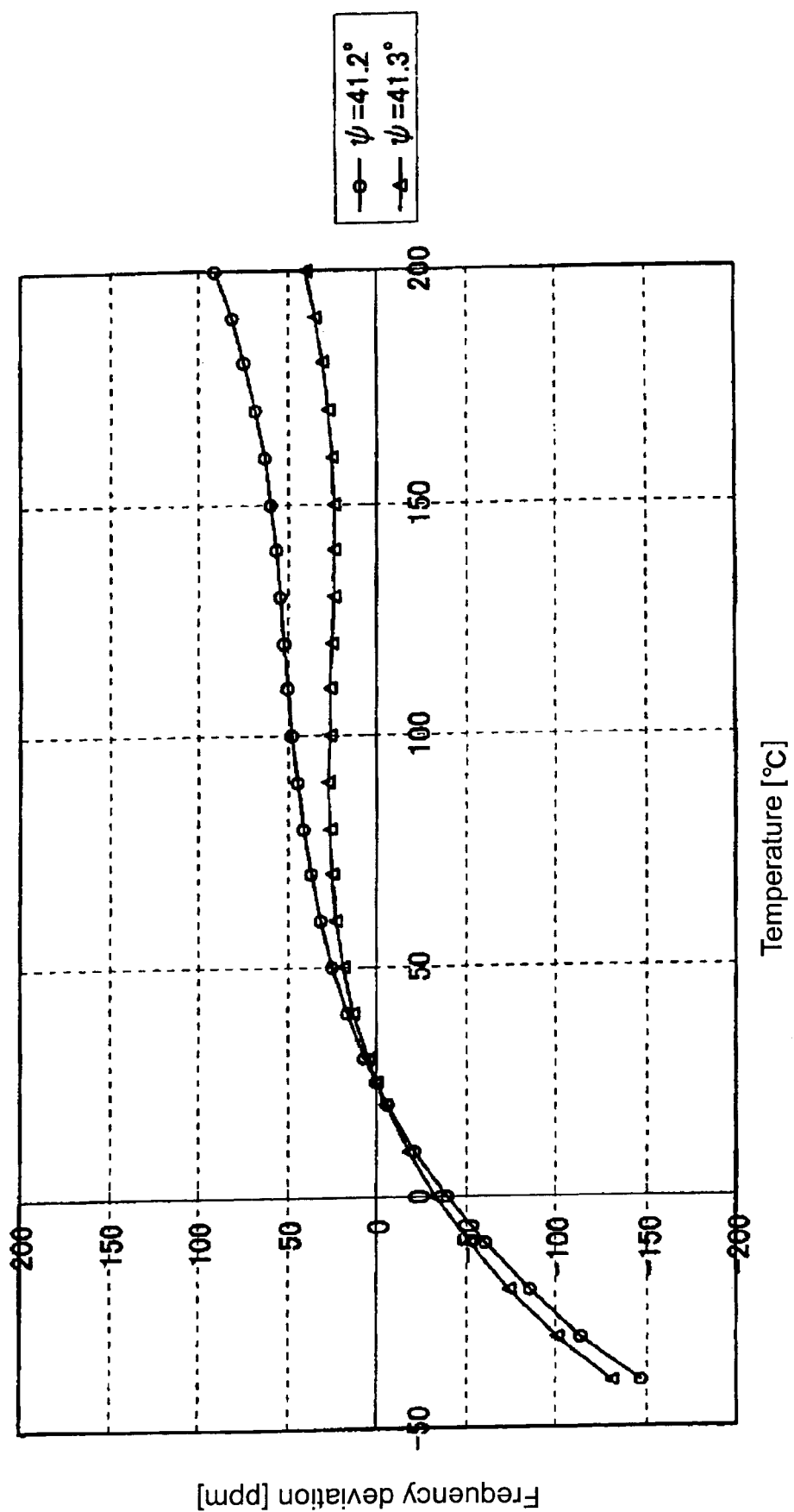
FIG. 8 is a graph showing whether there is an extreme value of the three-dimensional function for the resonator SAW device including the in-plane rotation ST-cut quartz plate whose Euler angle is set at (0°, 113° to 135°, +/−(40 to 49)°)
Figure 9:
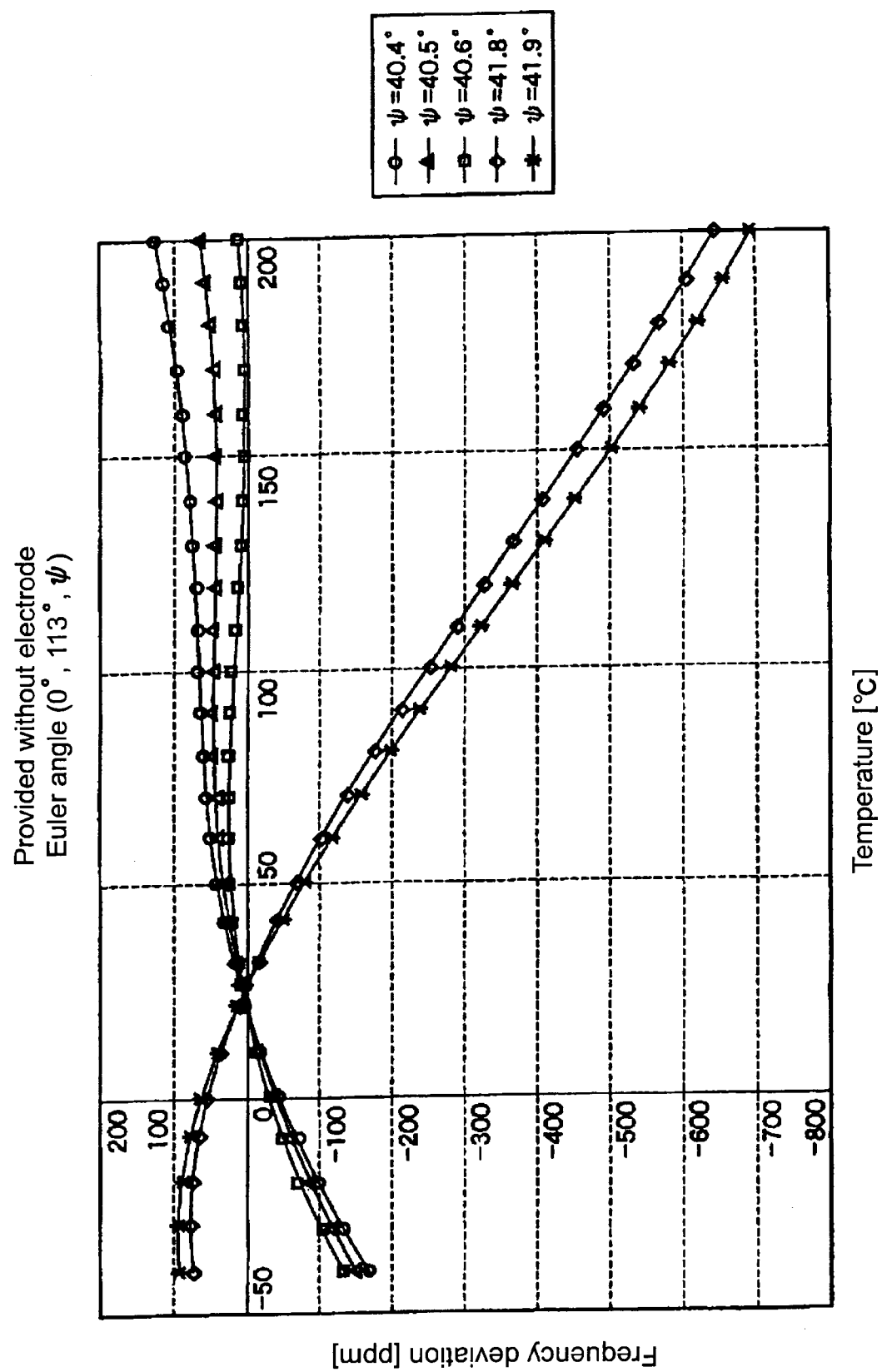
FIG. 9 is a graph showing whether there is an extreme value of the three-dimensional function for the transversal SAW filter including the in-plane rotation ST-cut quartz plate whose Euler angle is set at (0°, 113° to 135°, +/−(40 to 49)°)
Figure 25:
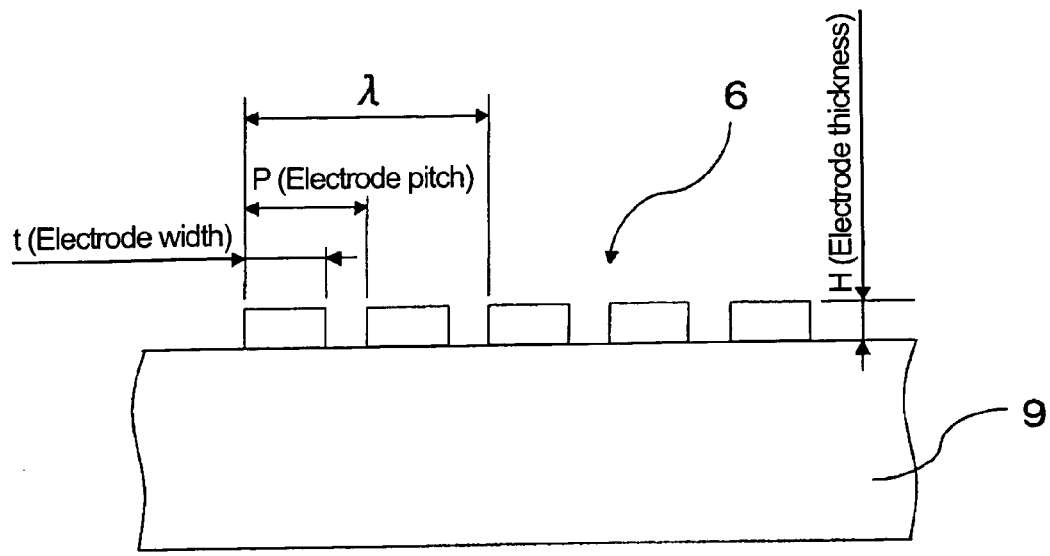
FIG. 25 is a sectional view of a SAW element, indicating the electrode width, the electrode pitch, "H" and "λ"

FIG. 4 is a graph showing whether there is an extreme value of temperature characteristics as a three-dimensional function in a temperature range from −40 to 85° C. for the resonator SAW device comprising the in-plane rotation ST-cut quartz plate 9 with Euler angle at (0°, 123°, +/−(40 to 49)°). The ratio of an electrode thickness "H" to a SAW wavelength "λ" (H/λ) is 0.03. The thickness "H" and the SAW wavelength "λ" of IDT electrodes are indicated in FIG. 25, which is a sectional view of a SAW element. As shown in FIG. 4, when an in-plane rotation angle "ψ" is set smaller than angles covered by the hatched area 4 shown in FIG. 3, it is clear that temperature characteristics do not have an extreme value in a temperature range from −40 to 85° C. In contrast, when the in-plane rotation angle "ψ" is set larger than angles covered by the hatched area 4 shown in FIG. 3, it is clear that temperature characteristics have an extreme value. For example, FIG. 4 shows that when "ψ" is set at 44°, there is an extreme value around −30° C., which is covered by the hatched area 5.

Figure 10:
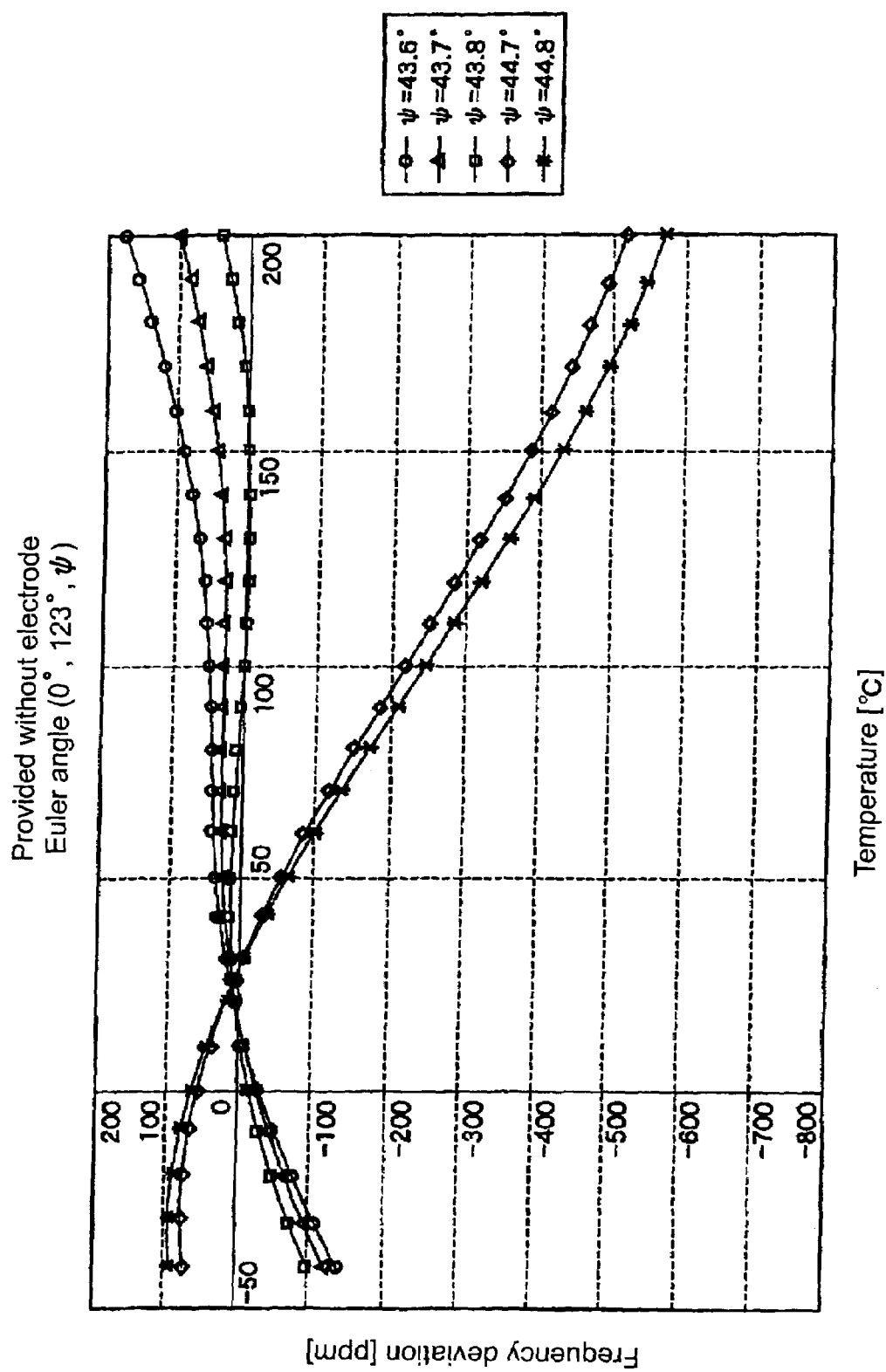
FIG. 10 is a graph showing whether there is an extreme value of the three-dimensional function for the transversal SAW filter including the in-plane rotation ST-cut quartz plate whose Euler angle is set at (0°, 113° to 135°, +/−(40 to 49)°)
Figure 11:
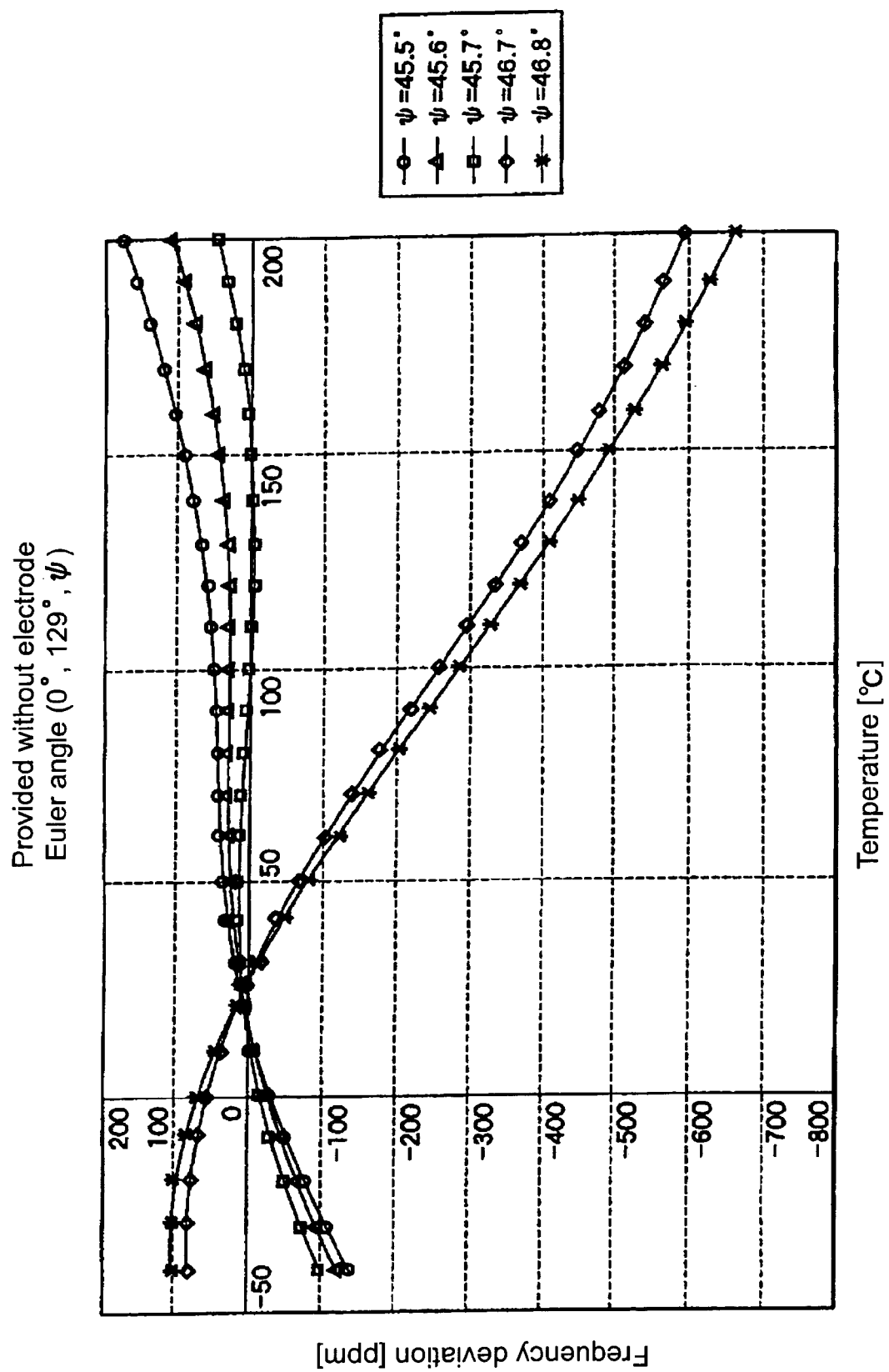
FIG. 11 is a graph showing whether there is an extreme value of the three-dimensional function for the transversal SAW filter including the in-plane rotation ST-cut quartz plate whose Euler angle is set at (0°, 113° to 135°, +/−(40 to 49)°)
Figure 12:
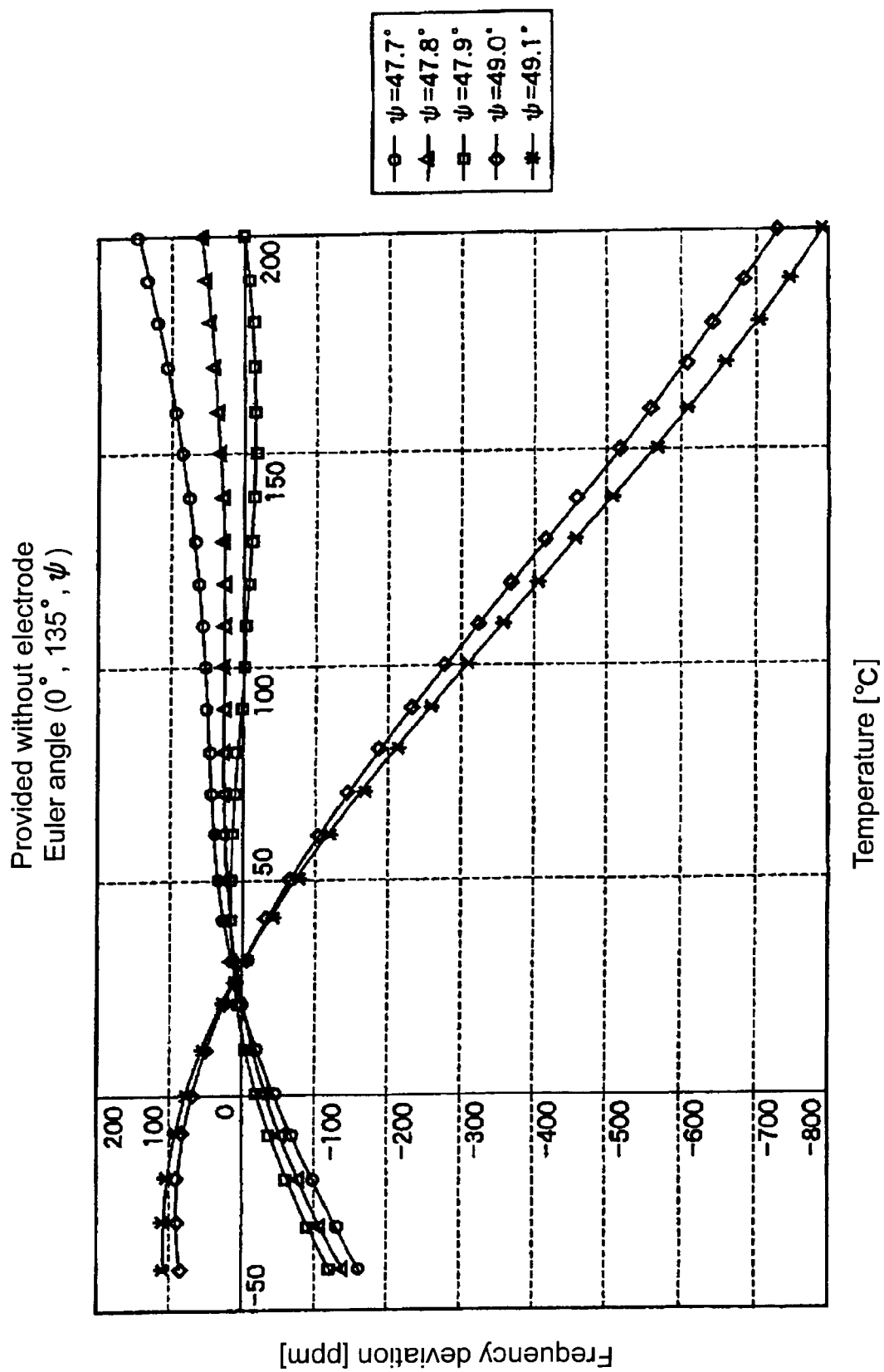
FIG. 12 is a graph showing whether there is an extreme value of the three-dimensional function for the transversal SAW filter including the in-plane rotation ST-cut quartz plate whose Euler angle is set at (0°, 113° to 135°, +/−(40 to 49)°)

FIGS. 4 and 10 show that "ψ" of the Euler angle (0°, θ, ψ) which represents a temperature characteristic curve of a similar pattern is different depending on whether electrodes are provided or not, even if "θ" of the same value. For example, the value of "ψ" on the border of having an extreme value is 43.7° in FIG. 10, while the value is 42.7° in FIG. 4, which is one degree smaller than in FIG. 10. In other words, electrodes make it difficult to find a temperature characteristic with an extreme value (a local maximum or local minimum value) in a temperature range from −40 to 85° C. within the range of "ψ" covered only by the hatched area 5 shown in FIG. 3. Then, if the area obtained by transferring the hatched area 5 shown in FIG. 3 so as to make the value "ψ" one degree smaller (namely, the hatched area 4), and the hatched area 5 are both included, it is possible to easily find a temperature characteristic with an extreme value (a local maximum or local minimum value) in a temperature range from −40 to 85° C. regardless of whether electrodes are provided. The area that covers both the hatched area 4 and the hatched area 5 is defined by Formula 1.

Each of FIGS. 5 to 8 shows a temperature characteristic of the resonator SAW device whose Euler angle is (0°, 117°, ψ), (0°, 129°, ψ), or (0°, 135°, ψ). These graphs show that although a temperature characteristic with an extreme value (a local maximum or local minimum value) in a temperature range from −40 to 85° C. within the range off "ψ" covered only by the hatched area 5 shown in FIG. 3 is not easily available, it is easily available in the same temperature area within the area covered by both the hatched area 4 and the hatched area 5.

Figure 13:
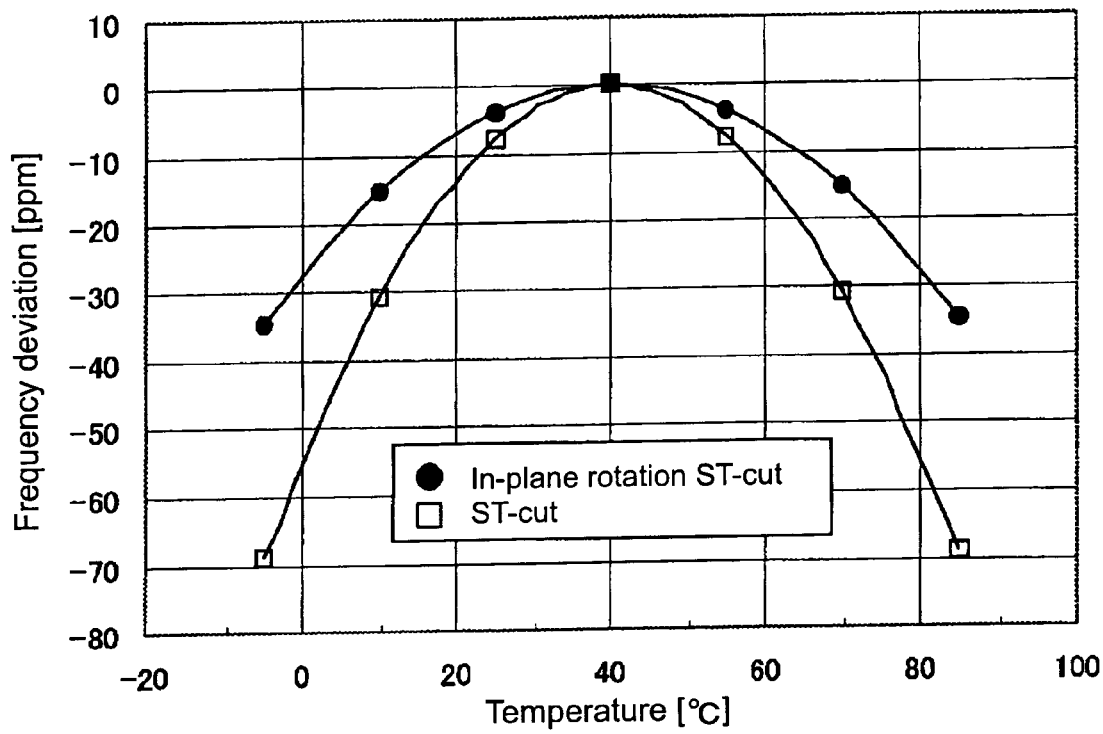
FIG. 13 is a graph comparing a temperature characteristic curve of the ST-cut SAW device whose Euler angle is set at (0°, 123°, 0°) with a temperature characteristic curve of the in-plane rotation ST-cut SAW device.

FIG. 13 shows a temperature characteristic curve of the in-plane rotation ST-cut SAW device 3 whose extreme value is set around room temperature under the condition that each value of Euler angles satisfies Formula 1, in comparison with a temperature characteristic curve of the ST-cut SAW device whose Euler angle is set at (0°, 123°, 0°). As shown in FIG. 13, including the range of Euler angles that satisfy Formula 1 makes it easier for the device 3 to have a good temperature characteristic with an extreme value (a local maximum or local minimum value) compared to the case with the ST-cut SAW device.

Figure 15:
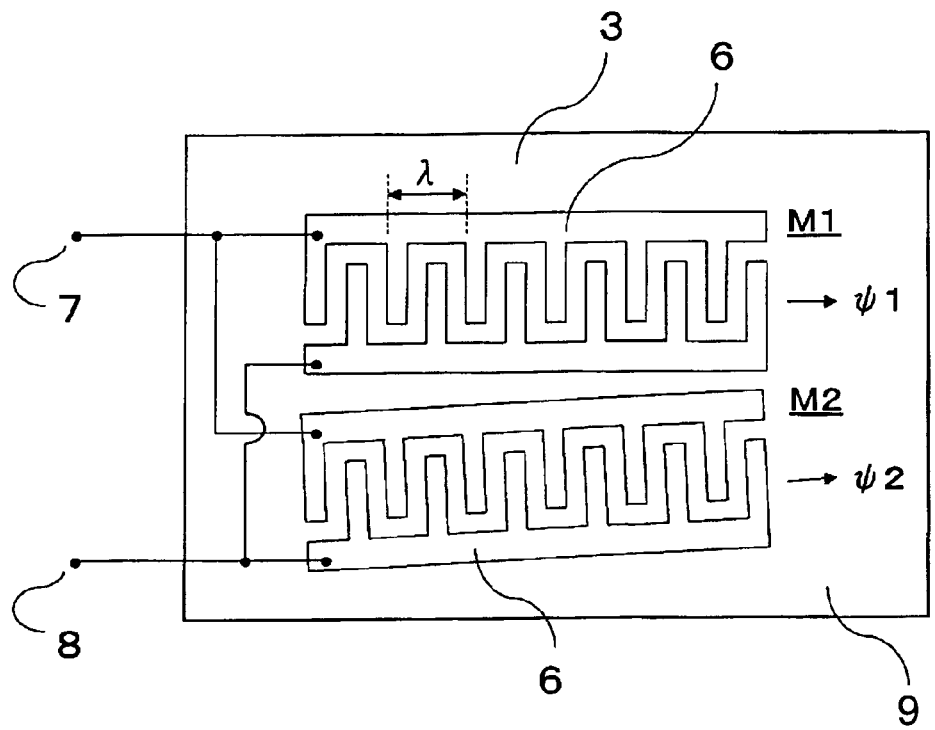
FIG. 15 is a schematic showing a first exemplary embodiment of the in-plane rotation ST-cut SAW device according to the invention.
Figure 27:
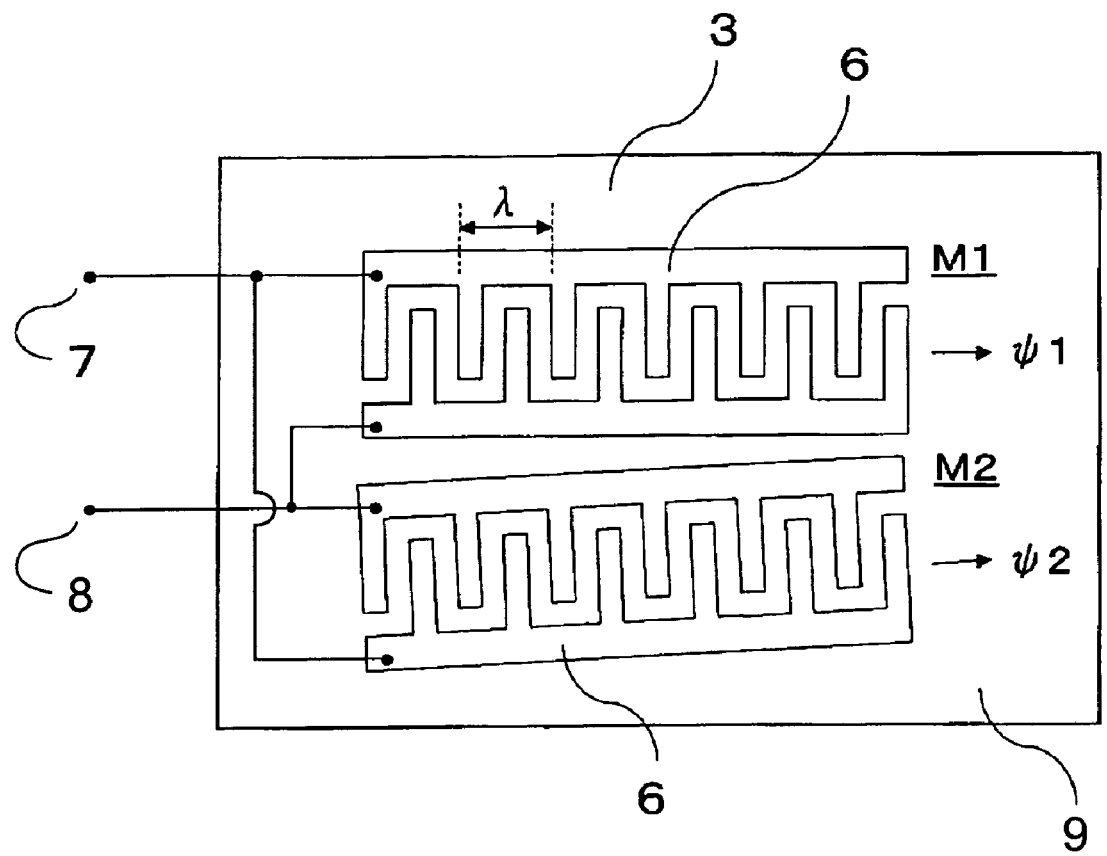
FIG. 27 is a schematic showing a first exemplary embodiment of the in-plane rotation ST-cut SAW device according to the invention.

FIG. 15 is a schematic showing the first exemplary embodiment of the in-plane rotation ST-cut SAW device 3 according to the invention. The in-plane rotation ST-cut SAW device 3 includes the in-plane rotation ST-cut quartz plate 9 as a base plate. On the main surface of the in-plane rotation ST-cut quartz plate 9, two SAW elements M1 and M2 are disposed so as to generate SAW having the propagation directions ψ1 and ψ2 which are different each other. Each of the two SAW elements M1 and M2 is provided with IDT electrodes 6. Furthermore, the IDT electrodes 6 are connected to an electrical terminal 7 and an electrical terminal 8 to supply a high frequency electric field. The positions of the electrical terminal 7 and the electrical terminal 8 are not limited to those shown in FIG. 15. For example, the electrical terminal 7 and the electrical terminal 8 can be connected to the IDT electrodes 6 at the positions shown in FIG. 27. The same can be said for second to sixth exemplary embodiments described below.

Figure 26:
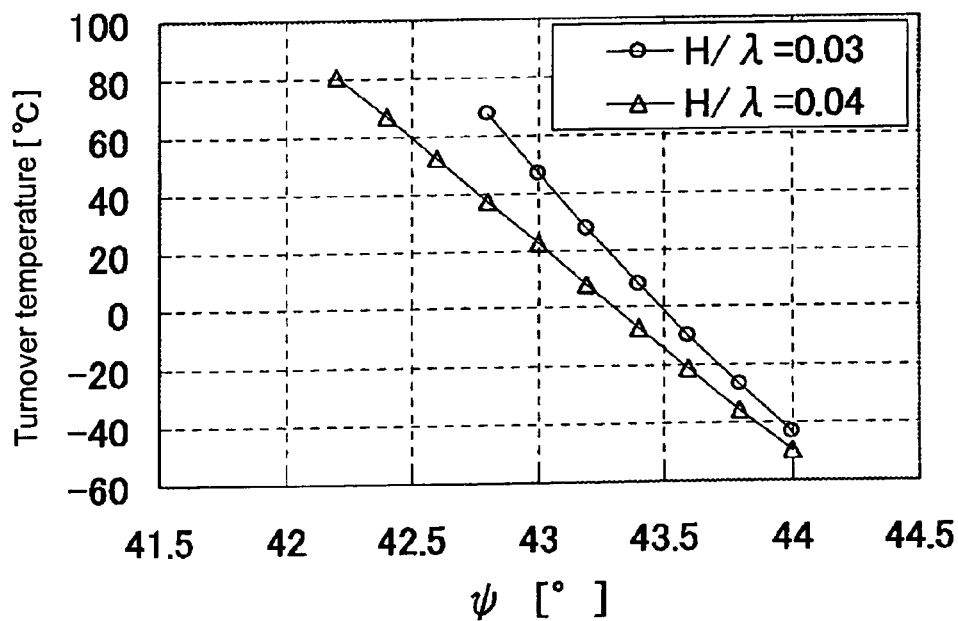
FIG. 26 is a schematic showing the relation between values "ψ" and turnover temperatures, under the condition that Euler angle is set at (0°, 123°, ψ) according to an exemplary embodiment of the invention, when H/λ is 0.03 or 0.04, and η is 0.5.

FIG. 26 shows an example of the relation between propagation angles and turnover temperatures of SAW in the above-mentioned range of Euler angles for the in-plane rotation ST-cut SAW device 3 according to the first exemplary embodiment of the invention.

Figure 18:
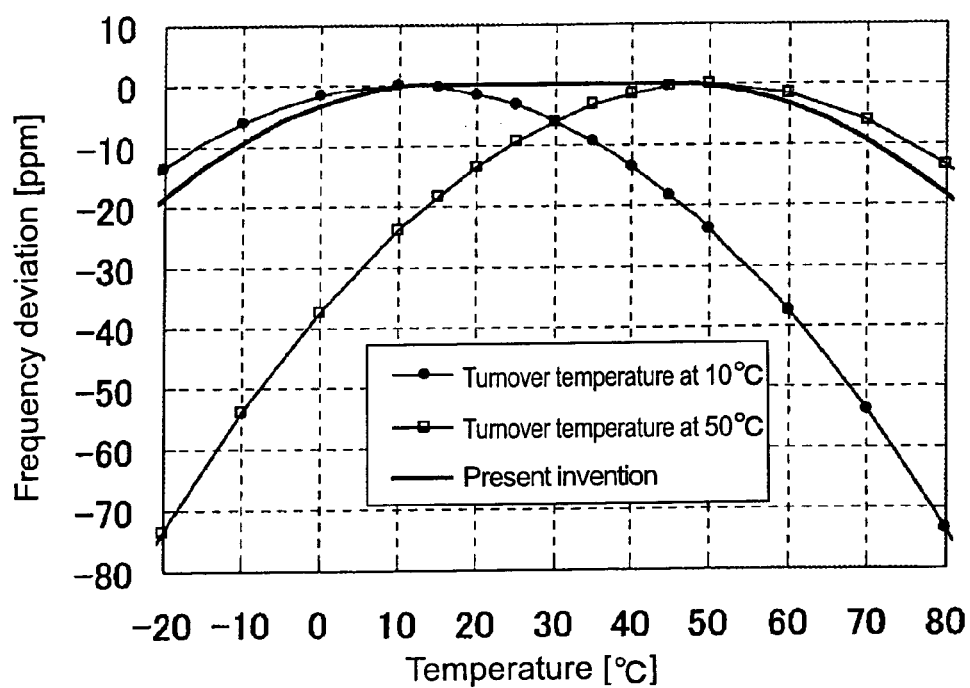
FIG. 18 is a schematic showing temperature characteristics of an exemplary embodiment of the in-plane rotation ST-cut SAW device according to the invention.

For example, when the two SAW elements, which satisfy H/λ=0.03, in FIG. 15 are electrically connected together in parallel so as to provide a good temperature characteristic in a wide range of temperatures by setting the turnover temperature of each of the SAW elements at about 50° C. and 10° C. as shown in FIG. 18, FIG. 26 shows that the propagation angles of the two SAW elements M1 and M2 are set at (0°, 123°, 43°) and (0°, 123°, 43.4°), respectively. There is only a small angle of 0.4° made between the two SAW elements M1 and M2.

That is to say, in the range of Euler angles which satisfy Formula 1, the turnover temperature of temperature characteristics is variable with a small change in propagation directions. This means that it is possible to decrease an angle between the two SAW elements M1 and M2, both of which are disposed on the in-plane rotation ST-cut quartz plate 9.

Figure 24:
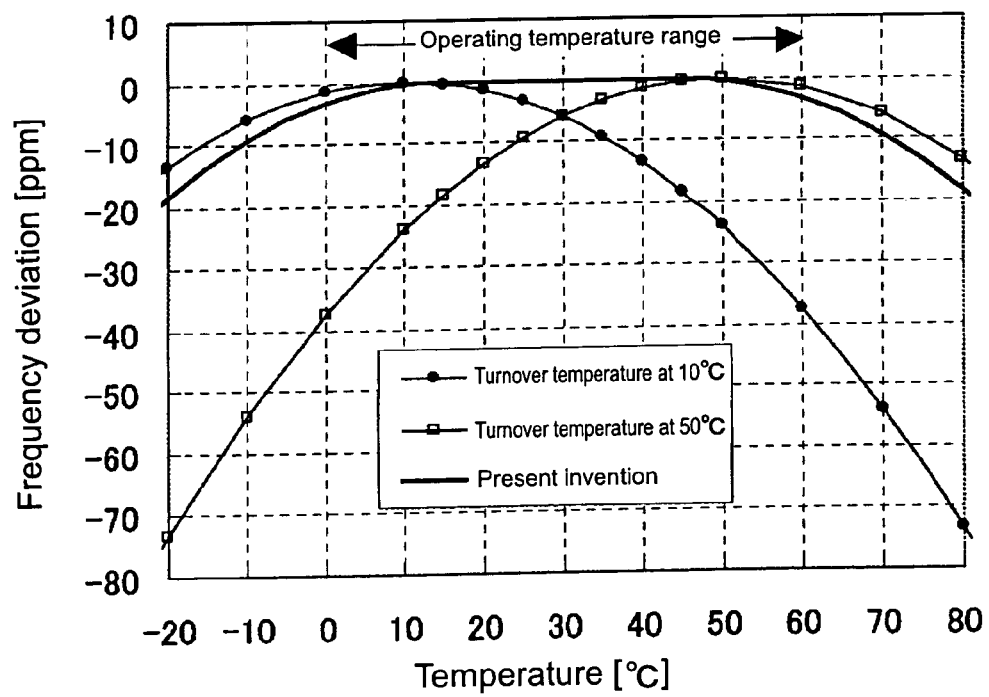
FIG. 24 is a schematic showing temperature characteristics of an exemplary embodiment of the in-plane rotation ST-cut SAW device according to the invention.

FIG. 24 is a graph showing temperature characteristics of the in-plane rotation ST-cut SAW device 3 comprising the in-plane rotation ST-cut quartz plate 9, on which the two SAW elements M1 and M2 are disposed, where turnover temperatures are at 10° C. and 50° C. in the operating temperature range from 0 to 60° C. For example, FIG. 26 shows that, if each turnover temperature tends to be low due to a deviation from a manufacturing process, a predetermined angle of the SAW element M1 and that of the SAW element M2 disposed on the in-plane rotation ST-cut quartz plate 9 is decreased so as to raise turnover temperatures to be appropriate values. Conversely, for example, when the operating temperature range is changed to a higher one than in FIG. 24, desired turnover temperatures are readily achieved by increasing a predetermined angle of the SAW element M1 and that of the SAW element M2 disposed on the in-plane rotation ST-cut quartz plate 9.

In other words, even if turnover temperatures Tp1 and Tp2 of temperature characteristics of the two SAW elements M1 and M2, respectively, deviate from desired values, a good temperature characteristic in a certain operating temperature range is available. Furthermore, when changing the operating temperature range, it is also possible to change without difficulty the range of temperatures where good temperature characteristics are available.

In summary, the effects of the first exemplary embodiment are as follows.

(1) The angle made between SAW elements can be decreased by disposing them in a manner that the propagation directions of SAW are different each other on the in-plane rotation ST-cut quartz plate 9. This makes it possible to miniaturize the in-plane rotation ST-cut SAW device 3 on which the SAW elements are disposed.

(2) It is possible to readily respond to a deviation of temperature characteristics caused by a deviation from a manufacturing process, and changes in operating temperature ranges.

(3) A good temperature characteristic is available in a wide temperature range.

[Second Exemplary Embodiment]

Next, a second exemplary embodiment in which the present invention is described below with reference to the drawings.

Figure 19:
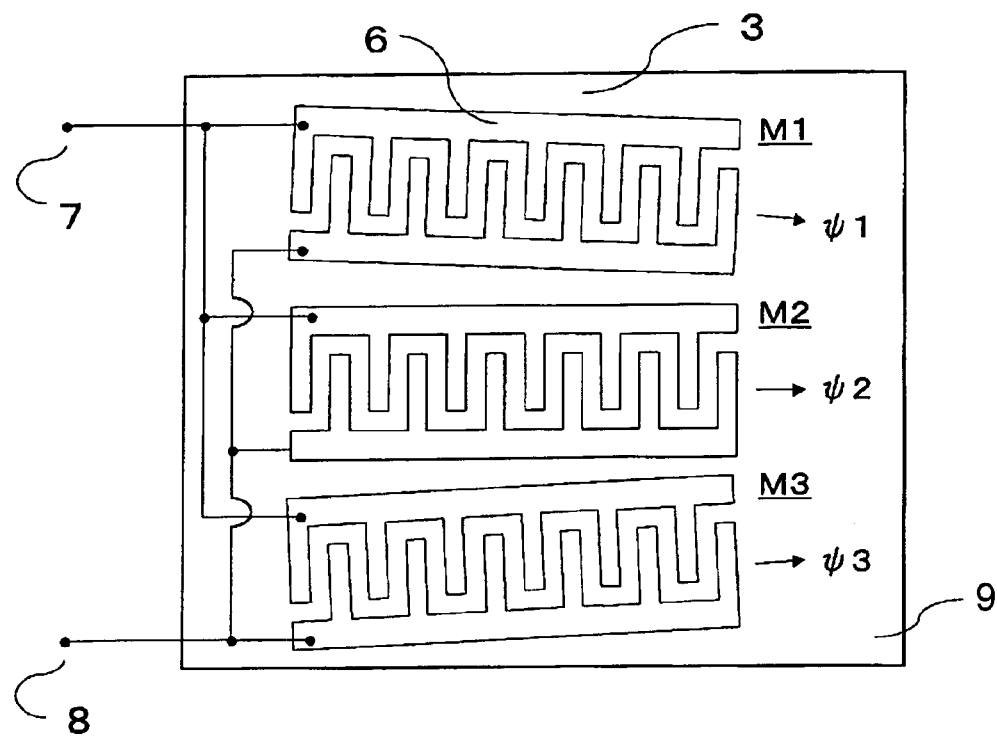
FIG. 19 is a schematic showing a second exemplary embodiment of the in-plane rotation ST-cut SAW device according to the invention.

FIG. 19 shows the second exemplary embodiment of the in-plane rotation ST-cut SAW device 3 according to the invention. The second exemplary embodiment is different from the first exemplary embodiment in a point that three SAW elements M1, M2, and M3 are disposed on the main surface of the in-plane rotation ST-cut quartz plate 9. Furthermore, the three SAW elements M1, M2, and M3 are disposed so as to generate SAW having the propagation directions ψ1, ψ2, and ψ3 which are different each other.

Figure 22:
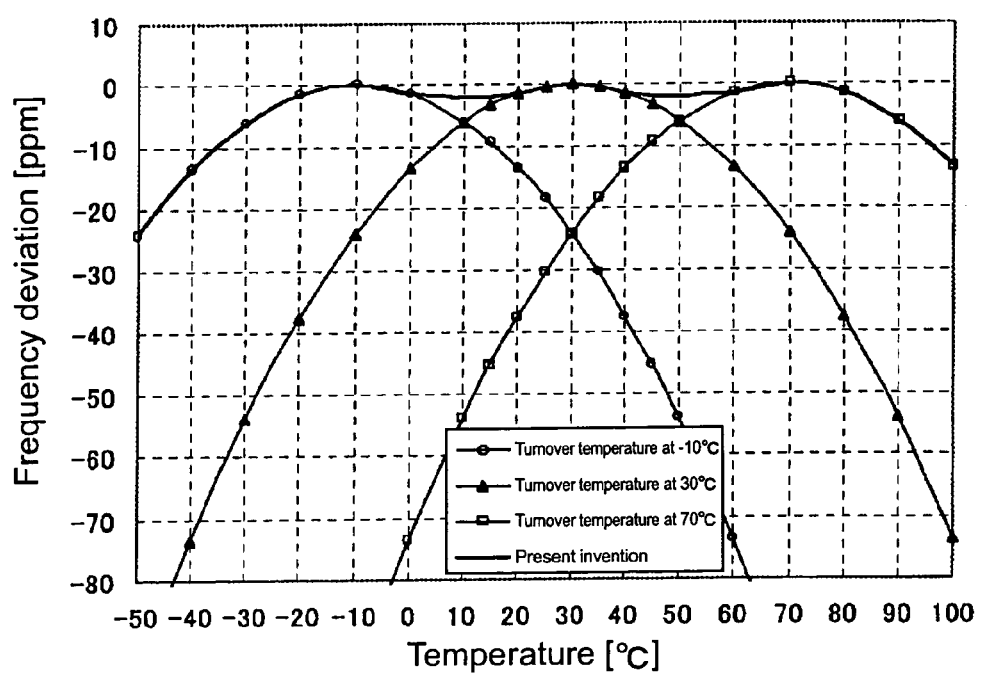
FIG. 22 is a schematic showing temperature characteristics of an exemplary embodiment of the in-plane rotation ST-cut SAW device according to the invention.

In FIG. 19, the three SAW elements M1, M2, and M3, all of which satisfy H/λ=0.03, are electrically connected together in parallel. In order to provide a good temperature characteristic in a wider range of temperatures by setting the turnover temperature of each of the SAW elements at about 70° C., 30° C., and −10° C. as shown in FIG. 22, FIG. 26 shows that the propagation angles of the three SAW elements M1, M2, and M3 are set at (0°, 123°, 42.8°), (0°, 123°, 43.2°) and (0°, 123°, 43.6°), respectively. To put it another way, there is only a small angle of 0.8° made between a SAW element providing a minimum turnover temperature and a SAW element providing a maximum value of turnover temperatures.

That is to say, in the range of Euler angles which satisfy Formula 1, the turnover temperature of temperature characteristics is variable with a tiny change in propagation directions. This means that it is possible to decrease an angle among a plurality of SAW elements M1 to Mn, all of which are disposed on the in-plane rotation ST-cut quartz plate 9.

Figure 23:
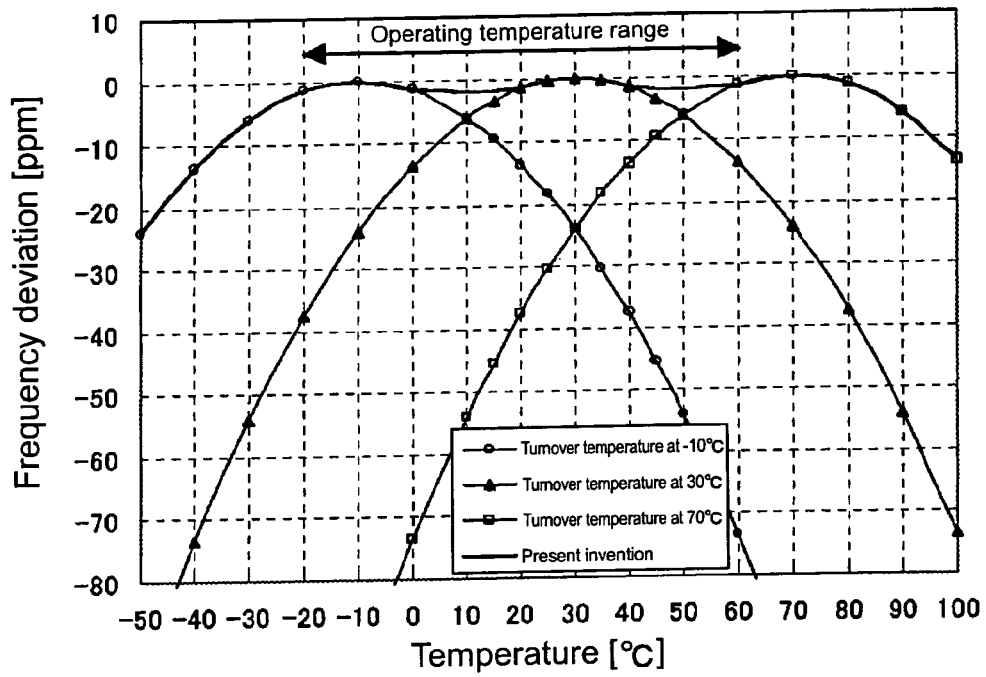
FIG. 23 is a schematic showing temperature characteristics of an exemplary embodiment of the in-plane rotation ST-cut SAW device according to the invention.

FIG. 23 is a graph showing a case where a maximum value of turnover temperatures is out of an operating temperature range for temperature characteristics of the in-plane rotation ST-cut SAW device 3 including the in-plane rotation ST-cut quartz plate 9, on which the three SAW elements M1, M2, and M3 are disposed. In this case, the operating temperature range is from 0 to 60° C., while the maximum value of turnover temperatures is 70° C. Therefore, even if each turnover temperature is lowered by 20° C. due to a deviation from a manufacturing process, maximum and minimum values of frequency deviations within the operating temperature range are almost free of influence. As a result, even if turnover temperatures Tp1, Tp2, and Tp3 of temperature characteristics of the three SAW elements M1, M2, and M3, respectively, deviate from desired values due to a deviation from a manufacturing process, a good temperature characteristic in a certain operating temperature range is available.

In other words, even if turnover temperatures Tp1 to Tpn of temperature characteristics of the SAW elements M1 to Mn, respectively, deviate from desired values due to a deviation from a manufacturing process, a good temperature characteristic in a certain operating temperature range is available. Moreover, when changing the operating temperature range, it is also possible to change without difficulty the range of temperatures where a good temperature characteristic is available.

As described in detail above, the second exemplary embodiment of the invention produces the following effect in addition to the above-mentioned effects (1) and (2) described in the first exemplary embodiment.

(4) It is possible not only to provide a good temperature characteristic in a wider range of operating temperatures, but also to readily respond to larger changes in operating temperature ranges.

[Third Exemplary Embodiment]

Next, a third exemplary embodiment in which the present invention is described below with reference to the drawings.

Figure 16:
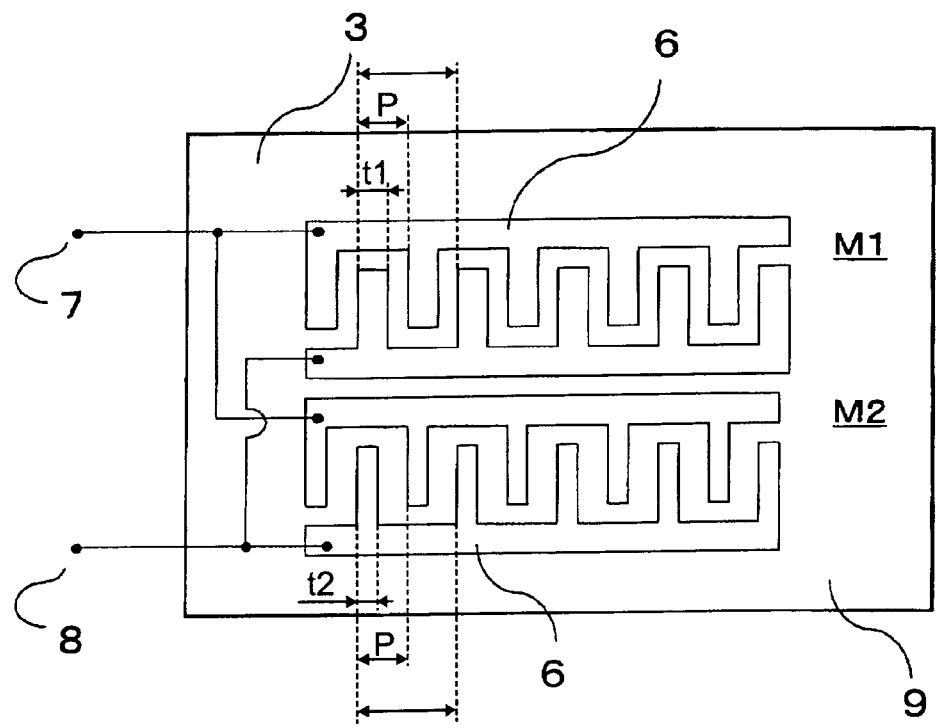
FIG. 16 is a schematic showing a third exemplary embodiment of the in-plane rotation ST-cut SAW device according to the invention.

FIG. 16 shows the third exemplary embodiment of the in-plane rotation ST-cut SAW device 3 according to the invention. The two SAW elements M1 and M2 are disposed on the main surface of the in-plane rotation ST-cut quartz plate 9. The third exemplary embodiment is different from the first and second exemplary embodiments in a point that the two SAW elements M1 and M2 are disposed so as to generate SAW having the same propagation direction. FIG. 25 is a sectional view of the two SAW elements M1 and M2. On the main surface of the in-plane rotation ST-cut quartz plate 9, the IDT electrodes 6, whose electrode width "t" and electrode pitch "P" are indicated in the sectional view, is disposed. The third exemplary embodiment is also different from the first and second exemplary embodiments in a point that the ratios η1 and η2 (η=t/P) obtained by dividing the electrode width by the electrode pitch of the IDT electrodes of the two SAW elements M1 and M2 are different each other.

Although the third exemplary embodiment shows an example where each electrode pitch "P" is the same, while each electrode width "t" is different, the opposite case where each electrode pitch "P" is different and each electrode width "t" is the same is also possible. Furthermore, both of each electrode pitch "P" and each electrode width "t" can be differentiated.

Figure 14:
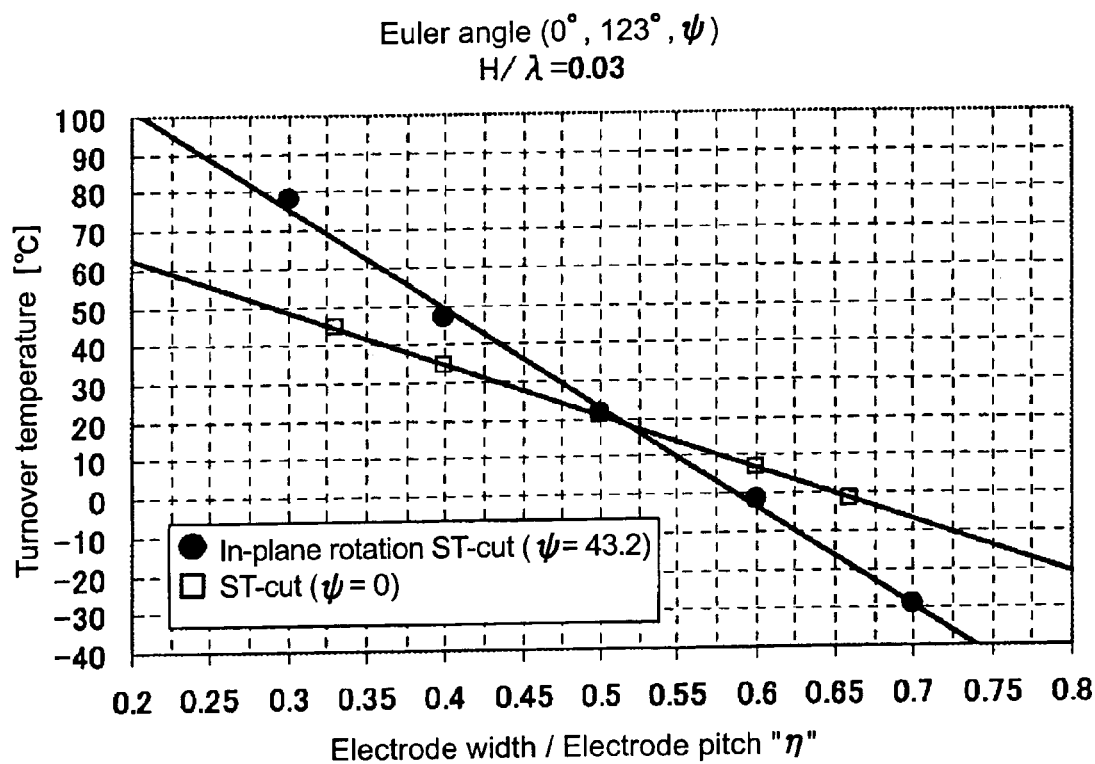
FIG. 14 is a schematic showing the relation between ratios "η" and turnover temperatures, under the condition that Euler angle is set at (0°, 123°, 0°), or (0°, 123°, 43.2°) according to an exemplary embodiment of the invention, when H/λ is 0.03.

FIG. 14 shows, regarding the in-plane rotation ST-cut SAW device 3 of the third exemplary embodiment, an example of the relation between ratios "η" obtained by dividing the electrode width by the electrode pitch and turnover temperatures of the IDT electrodes when Euler angles satisfy Formula 1, and an example of the relation between ratios "η" (t/P) and turnover temperatures of the IDT electrodes of the ST-cut SAW device whose Euler angle is set at (0°, 123°, 0°). As shown in FIG. 14, the turnover temperatures of the in-plane rotation ST-cut SAW device 3 are more variable than those of the ST-cut SAW device, because of the value "η" (t/P). This makes it possible for the in-plane rotation ST-cut SAW device 3 to have a wider range of turnover temperatures. Therefore, a good temperature characteristic is easily available in a wider range of temperatures.

For example, when the two SAW elements, which satisfy H/λ=0.03, in FIG. 16 are electrically connected together in parallel so as to provide a good temperature characteristic in a wide range of temperatures by setting the turnover temperature of each of the SAW elements at about 50° C. and 10° C. as shown in FIG. 18, FIG. 14 shows that the ratios η1 and η2 of the IDT electrodes of the two SAW elements M1 and M2 are set at about 0.4 and 0.55, respectively.

Therefore, in a range of Euler angles which satisfy Formula 1, by disposing both the two SAW elements M1 and M2 whose ratios "η" are different each other on the in-plane rotation ST-cut quartz plate 9, a good temperature characteristic can be obtained, which are not attained by a single SAW element. Moreover, it is possible to dispose each IDT electrode of the SAW elements not in a tilted position but in parallel. This makes it possible to miniaturize the in-plane rotation ST-cut SAW device 3 comprising the in-plane rotation ST-cut quartz plate 9 on which the SAW elements M1 and M2 are disposed.

FIG. 24 is a graph showing temperature characteristics of the in-plane rotation ST-cut SAW device 3 including the in-plane rotation ST-cut quartz plate 9, on which the two SAW elements M1 and M2 are disposed, where turnover temperatures are at 10° C. and 50° C. in the operating temperature range from 0 to 60° C. FIG. 26 shows an example of the relation between values "ψ" and turnover temperatures in the range of Euler angles which satisfy Formula 1 for the in-plane rotation ST-cut SAW device 3 according to the exemplary embodiment.

For example, FIG. 26 shows that, if each turnover temperature shown in FIG. 24 tends to be low due to a deviation from a manufacturing process, a predetermined angle of the SAW element M1 and that of the SAW element M2 disposed on the in-plane rotation ST-cut quartz plate 9 is decreased so as to raise turnover temperatures to be appropriate values. Conversely, for example, when the operating temperature range is changed to a higher one than in FIG. 24, desired turnover temperatures are readily achieved by increasing a predetermined angle of the SAW element M1 and that of the SAW element M2 disposed on the in-plane rotation ST-cut quartz plate 9.

In other words, even if turnover temperatures Tp1 and Tp2 of temperature characteristics of the two SAW elements M1 and M2, respectively, deviate from desired values, a good temperature characteristic in a certain operating temperature range is available. Furthermore, when changing the operating temperature range, it is also possible to change without difficulty the range of temperatures where a good temperature characteristic is available.

As described in detail above, the third exemplary embodiment of the invention produces the following effect in addition to the above-mentioned effects (1), (2), and (3) described in the first exemplary embodiment.

(5) The IDT electrodes of the SAW element to be disposed can be further miniaturized by being disposed in parallel.

[Fourth Exemplary Embodiment]

Next, a fourth exemplary embodiment in which the present invention is described below with reference to the drawings.

Figure 20:
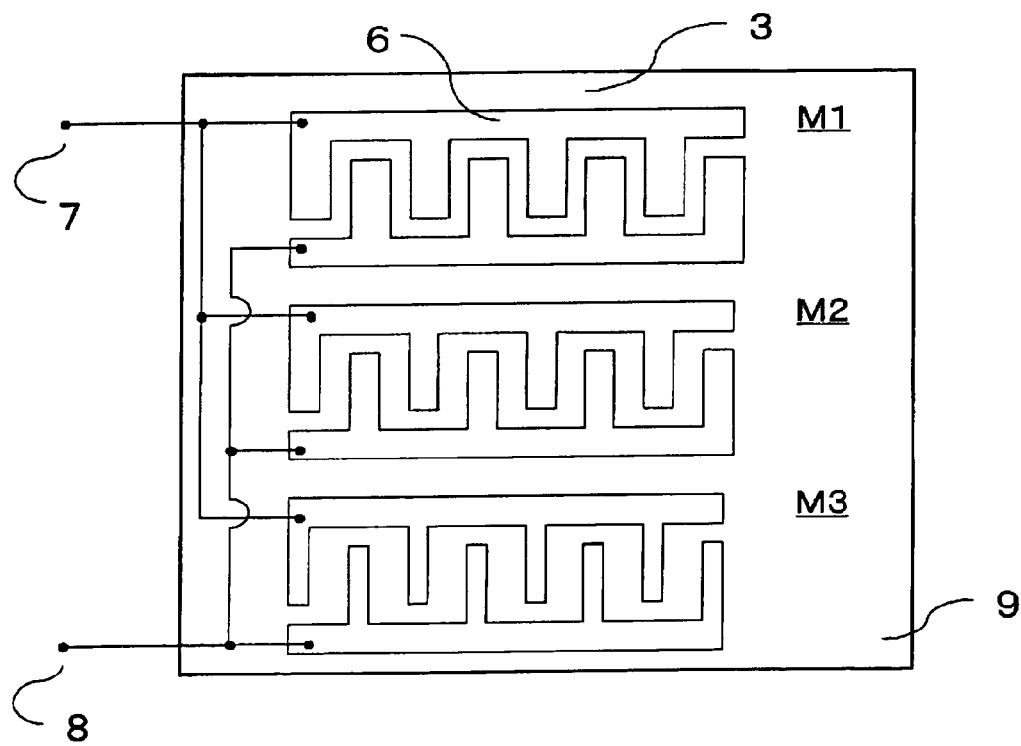
FIG. 20 is a schematic showing a fourth exemplary embodiment of the in-plane rotation ST-cut SAW device according to the invention.

FIG. 20 shows the fourth exemplary embodiment of the in-plane rotation ST-cut SAW device 3 according to the invention. The three SAW elements M1, M2, and M3 are disposed on the main surface of the in-plane rotation ST-cut quartz plate 9. The three SAW elements M1, M2, and M3 are disposed so as to generate SAW having the same propagation direction. Furthermore, the fourth exemplary embodiment is different from the first to third exemplary embodiments in a point that the ratios η1, η2, and η3 (η=t/P) obtained by dividing the electrode width by the electrode pitch of the IDT electrodes of the three SAW elements M1, M2, and M3 are different each other.

When the three SAW elements M1, M2, and M3, which satisfy H/λ=0.03, in FIG. 20 are electrically connected together in parallel so as to provide a good temperature characteristic in a wider range of temperatures by setting the turnover temperature of each of the SAW elements at about 70° C., 30° C. and −10° C. as shown in FIG. 22, FIG. 14 shows that the ratios η1, η2, and η3 of the IDT electrodes of the three SAW elements M1, M2, and M3 are set at 0.325, 0.475, and 0.625, respectively.

Therefore, in a range of Euler angles which satisfy Formula 1, disposing all of the three SAW elements M1, M2, and M3, whose ratios "η" are different each other, on the in-plane rotation ST-cut quartz plate 9 makes it possible not only to provide a good temperature characteristic, which is not attained by a single SAW element, but also to dispose the IDT electrodes of the three SAW elements in parallel without tilting them.

In other words, better temperature characteristics can be achieved by disposing a plurality of SAW elements M1 to Mn whose ratios "η" are different each other on the in-plane rotation ST-cut quartz plate 9. Moreover, it is possible to dispose the IDT electrodes of a plurality of SAW elements M1 to Mn not in a tilted position but in parallel.

FIG. 23 is a graph showing a case where a maximum value of turnover temperature is out of an operating temperature range for temperature characteristics of the in-plane rotation ST-cut SAW device 3 including the in-plane rotation ST-cut quartz plate 9, on which the three SAW elements M1, M2, and M3 are disposed. In this case, the operating temperature range is from −20 to 60° C., while the maximum value of turnover temperatures is 70° C. Therefore, even if each turnover temperature is lowered by 20° C. due to a deviation from a manufacturing process, maximum and minimum values of frequency deviations within the operating temperature range are almost free of influence. In other words, even if turnover temperatures Tp1 to Tpn of temperature characteristics of a plurality of SAW elements M1 to Mn deviate from desired values due to a deviation from a manufacturing process, a good temperature characteristic in a certain operating temperature range is available.

As described in detail above, the fourth exemplary embodiment of the invention also produces the above-mentioned effects (1), (2), (4), and (5) described in the first to third exemplary embodiments.

[Fifth Exemplary Embodiment]

Next, a fifth exemplary embodiment in which the present invention is described below with reference to the drawings.

Figure 17:
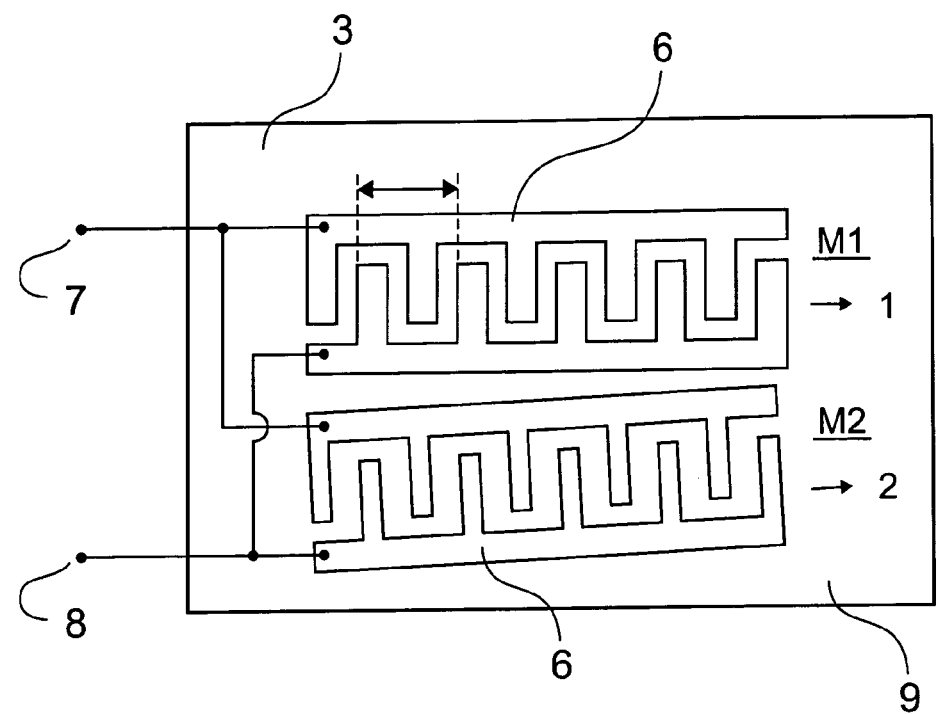
FIG. 17 is a schematic showing a fifth exemplary embodiment of the in-plane rotation ST-cut SAW device according to the invention.

FIG. 17 shows the fifth exemplary embodiment of the in-plane rotation ST-cut SAW device 3 according to the invention. The two SAW elements M1 and M2 are disposed on the main surface of the in-plane rotation ST-cut quartz plate 9 so as to generate SAW having the propagation directions ψ1 and ψ2 which are different each other. Furthermore, the fifth exemplary embodiment is different from the first to fourth exemplary embodiments in a point that the ratios η1 and η2 (η=t/P) obtained by dividing the electrode width by the electrode pitch of the IDT electrodes of the two SAW elements M1 and M2 are different each other.

As shown in FIG. 26, in the range of Euler angles which satisfy Formula 1, the turnover temperature of temperature characteristics is variable with a small change in the propagation directions. In other words, it is possible to decrease an angle between the two SAW elements M1 and M2, both of which are disposed on the in-plane rotation ST-cut quartz plate 9.

In addition, as shown in FIG. 14, in a range of Euler angles which satisfy Formula 1, disposing both of the two SAW elements M1 and M2, whose ratios "η" are different each other, on the in-plane rotation ST-cut quartz plate 9 makes it possible to provide a good temperature characteristic, which is not attained by a single SAW element. It is also possible to dispose the IDT electrodes of the two SAW elements in parallel.

In the fifth exemplary embodiment, by differentiating both the propagation directions "ψ" and the ratios "η" (η=t/P) of the IDT electrodes 6 between the two SAW elements as mentioned above, it is possible not only to further decrease an angle between the two SAW elements M1 and M2, but also to change turnover temperatures without extremely increasing or decreasing the ratios "η" (η=t/P) of the IDT electrodes 6. In particular, when "λ" decreases along with a high frequency, an extremely large value "η" is likely to cause a short-circuit due to a foreign substance, on one hand. On the other, an extremely small value "η" is likely to cause an electrode breaking. The fifth exemplary embodiment makes these defects less likely to occur.

As described in detail above, the fifth exemplary embodiment of the invention produces the following effect in addition to the above-mentioned effects (1), (2), and (3) described in the first exemplary embodiment.

(6) While it is necessary to decrease the electrode width and the electrode pitch as frequency increases, the fifth exemplary embodiment makes it possible to decrease the possibility of defects such as a short-circuit and a breaking of the IDT electrodes 6.

[Sixth Exemplary Embodiment]

Next, a sixth exemplary embodiment in which the present invention is described below with reference to the drawings.

Figure 21:
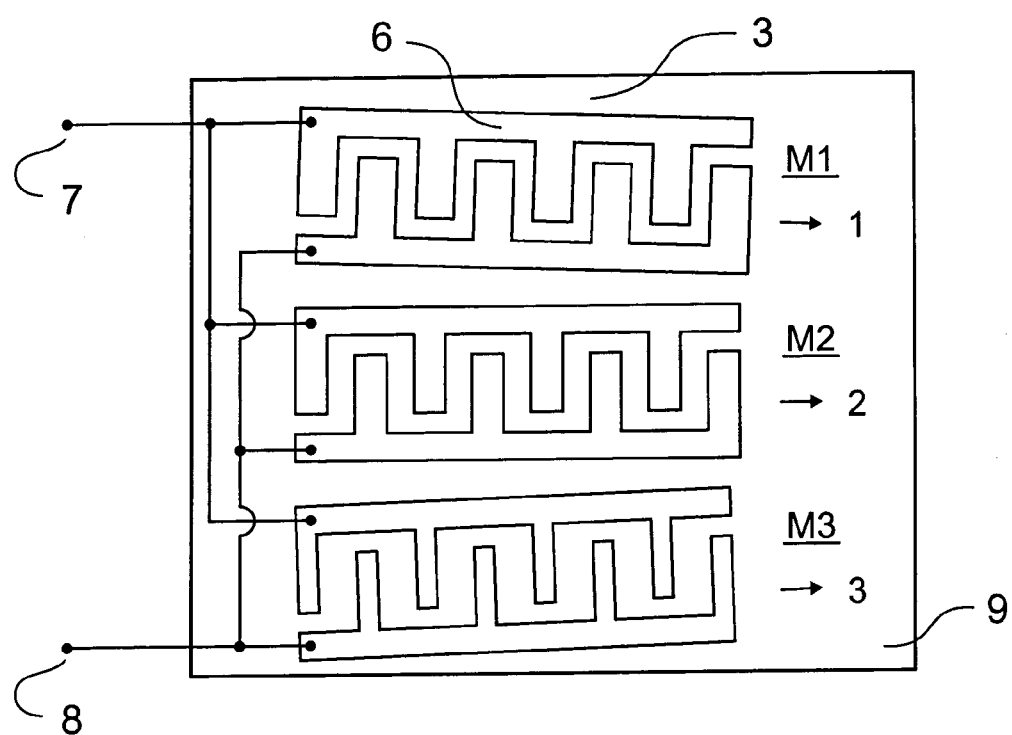
FIG. 21 is a schematic showing a sixth exemplary embodiment of the in-plane rotation ST-cut SAW device according to the invention.

FIG. 21 shows the sixth exemplary embodiment of the in-plane rotation ST-cut SAW device 3 according to the invention. The three SAW elements M1, M2, and M3 are disposed on the main surface of the in-plane rotation ST-cut quartz plate 9. The three SAW elements M1, M2, and M3 are disposed so as to generate SAW having the propagation directions $\psi 1$, $\psi 2$, and $\psi 3$ which are different each other. Furthermore, the sixth exemplary embodiment is different from the first to fifth exemplary embodiments in a point that the ratios $\eta 1$, $\eta 2$, and $\eta 3$ ($\eta = t/P$) obtained by dividing the electrode width by the electrode pitch of the IDT electrodes of the three SAW elements M1, M2, and M3 are different each other.

In the sixth exemplary embodiment, by differentiating both the propagation directions "$\psi$" and the ratios "$\eta$" ($\eta = t/P$) of the IDT electrodes 6 among the three SAW elements as mentioned above, it is possible not only to further decrease an angle among the three SAW elements M1, M2, and M3, but also to change turnover temperatures without extremely increasing or decreasing the ratios "$\eta$" ($\eta = t/P$) of the IDT electrodes 6. That is to say, it is possible not only to decrease an angle among a plurality of SAW elements M1 to Mn, but also to change turnover temperatures without extremely increasing or decreasing the ratios $\eta 1$ to $\eta n$ ($\eta = t/P$) obtained by dividing the electrode width by the electrode pitch of a plurality of the IDT electrodes 6.

As described in detail above, the sixth exemplary embodiment of the invention also produces the above-mentioned effects (1), (2), (4), and (6) described in the first, second, and fifth exemplary embodiments.

What is claimed is:

1. A surface acoustic wave device, comprising:
  a quartz plate cut out with a Euler angle at (0°, 113° to 135°, +/−(40 to 49)°); and
  a plurality of surface acoustic wave elements M1 to Mn connected together in parallel on a main surface of the quartz plate, and provided with at least a pair of IDT electrodes to generate a Rayleigh wave, surface acoustic waves having at least a plurality of different propagation directions of propagation directions $\psi 1$ to $\psi n$ being generated from the surface acoustic wave elements M1 to Mn, and the propagation directions $\psi 1$ to $\psi n$ satisfying a formula: $\psi 1$ to $\psi n = 0.3295\theta + 3.3318° +/− 1.125°$, with the Euler angle at (0°, θ, ψ).

2. A surface acoustic wave device, comprising:
  a quartz plate cut out with a Euler angle at (0°, 113° to 135°, +/−(40 to 49)°); and
  a plurality of surface acoustic wave elements M1 to Mn connected together in parallel on a main surface of the quartz plate, and provided with at least a pair of IDT electrodes to generate a Rayleigh wave, at least a plurality of different ratios $\eta 1$ to $\eta n$ obtained by dividing electrode width by electrode pitch of the IDT electrodes being given to the surface acoustic wave elements M1 to Mn, and the Euler angle at (0°, θ, ψ) satisfying a formula: $\psi = 0.3295\theta + 3.3318° +/− 1.125°$.

3. A surface acoustic wave device, comprising:
  a quartz plate cut out with a Euler angle at (0°, 113° to 135°, +/−(40 to 49)°); and
  a plurality of surface acoustic wave elements M1 to Mn connected together in parallel on a main surface of the quartz plate, and provided with at least a pair of IDT electrodes to generate a Rayleigh wave, at least a plurality of different ratios $\eta 1$ to $\eta n$ obtained by dividing electrode width by electrode pitch of the IDT electrodes being given to the surface acoustic wave elements M1 to Mn, surface acoustic waves having at least a plurality of different propagation directions of propagation directions $\psi 1$ to $\psi n$ being generated from the surface acoustic wave elements M1 to Mn, and the propagation directions $\psi 1$ to $\psi n$ satisfying a formula: $\psi 1$ to $\psi n = 0.3295\theta + 3.3318° +/− 1.125°$, with the Euler angle at (0°, θ, ψ).

4. The surface acoustic wave device according to claim 1, comprising:
  at least one of turnover temperatures Tp1 to Tpn of a temperature characteristic obtained by each of the surface acoustic wave elements M1 to Mn being out of an operating temperature range.

5. The surface acoustic wave device according to claim 2, comprising:
  at least one of turnover temperatures Tp1 to Tpn of a temperature characteristic obtained by each of the surface acoustic wave elements M1 to Mn being out of an operating temperature range.

6. The surface acoustic wave device according to claim 3, comprising:
  at least one of turnover temperatures Tp1 to Tpn of a temperature characteristic obtained by each of the surface acoustic wave elements M1 to Mn being out of an operating temperature range.

7. A method of adjusting a temperature characteristic of the surface acoustic wave device according to claim 1, comprising:
  adjusting the temperature characteristic by adjusting an angle of disposition of the surface acoustic wave device on the quartz plate cut out with a Euler angle at (0°, 113° to 135°, +/−(40 to 49)°).

8. A method of adjusting a temperature characteristic of the surface acoustic wave device according to claim 2, comprising:
  adjusting the temperature characteristic by adjusting an angle of disposition of the surface acoustic wave device on the quartz plate cut out with a Euler angle at (0°, 113° to 135°, +/−(40 to 49)°).

9. A method of adjusting a temperature characteristic of the surface acoustic wave device according to claim 3, comprising:
  adjusting the temperature characteristic by adjusting an angle of disposition of the surface acoustic wave device on the quartz plate cut out with a Euler angle at (0°, 113° to 135°, +/−(40 to 49)°).

10. A method of adjusting a temperature characteristic of the surface acoustic wave device according to claim 4, comprising:
  adjusting the temperature characteristic by adjusting an angle of disposition of the surface acoustic wave device on the quartz plate cut out with a Euler angle at (0°, 113° to 135°, +/−(40 to 49)°).

11. A method of adjusting a temperature characteristic of the surface acoustic wave device according to claim 5, comprising:

adjusting the temperature characteristic by adjusting an angle of disposition of the surface acoustic wave device on the quartz plate cut out with a Euler angle at (0°, 113° to 135°, +/−(40 to 49)°).

12. A method of adjusting a temperature characteristic of the surface acoustic wave device according to claim 6, comprising:

adjusting the temperature characteristic by adjusting an angle of disposition of the surface acoustic wave device on the quartz plate cut out with a Euler angle at (0°, 113° to 135°, +/−(40 to 49)°).

* * * * *